US008785904B2

(12) United States Patent
Zhang et al.

(10) Patent No.: US 8,785,904 B2
(45) Date of Patent: Jul. 22, 2014

(54) LIGHT-EMITTING DEVICE WITH LOW FORWARD VOLTAGE AND METHOD FOR FABRICATING THE SAME

(75) Inventors: Jianping Zhang, El Monte, CA (US); Hongmei Wang, El Monte, CA (US); Chunhui Yan, El Monte, CA (US)

(73) Assignee: InvenLux Corporation, El Monte, CA (US)

( * ) Notice: Subject to any disclaimer, the term of this patent is extended or adjusted under 35 U.S.C. 154(b) by 425 days.

(21) Appl. No.: 13/090,899

(22) Filed: Apr. 20, 2011

(65) Prior Publication Data

US 2012/0267655 A1     Oct. 25, 2012

(51) Int. Cl.
*H01L 29/06* (2006.01)
(52) U.S. Cl.
USPC .................. 257/13; 257/14; 257/15; 257/94; 257/E33.027
(58) Field of Classification Search
USPC ............... 257/94, E33.027, 9, 11–15; 438/47
See application file for complete search history.

(56) References Cited

U.S. PATENT DOCUMENTS

| 6,630,692 | B2 | 10/2003 | Goetz et al. | |
| 6,878,593 | B2 | 4/2005 | Khan et al. | |
| 7,026,653 | B2 | 4/2006 | Sun | |
| 7,700,384 | B2 | 4/2010 | Komada | |
| 2003/0209714 | A1* | 11/2003 | Taskar et al. | 257/79 |
| 2006/0192207 | A1 | 8/2006 | Wook Shim et al. | 257/79 |
| 2007/0278508 | A1 | 12/2007 | Baur et al. | 257/97 |
| 2009/0315038 | A1* | 12/2009 | Iwakami | 257/76 |
| 2010/0240162 | A1 | 9/2010 | Bae | 438/47 |
| 2011/0309329 | A1* | 12/2011 | Sugawara | 257/15 |
| 2013/0307026 | A1* | 11/2013 | Hwang et al. | 257/194 |

FOREIGN PATENT DOCUMENTS

| JP | 2005303252 A | * | 10/2005 |
| JP | 2007-149791 A | | 6/2007 |
| WO | WO 2008069422 A1 | * | 6/2008 |
| WO | WO 2008069482 A1 | * | 6/2008 |

OTHER PUBLICATIONS

Machine translation of JP 2005-303252.*
Notification of Transmittal of the International Search Report and the Written Opinion of the International Searching Authority, or the Declaration of international PCT Application No. PCT/US2012/034099, dated Sep. 24, 2012, which is where the listed references were cited.
J. Hertkorn et al., "Highly conductive modulation doped composition graded p-AlGaN(AlN)/GaN multiheterostructures grown by metalorganic vapor phase epitaxy" Journal of Applied Physic, vol. 106, pp. 013720-1 ~ 013720-6, (2009).
Yukio Narukawa et al., "White light emitting diodes with super-high luminous efficacy" Journal of Physics D: Applied Physics, vol. 43, 354002, pp. 1-6, (2010).

* cited by examiner

*Primary Examiner* — Samuel Gebremariam
*Assistant Examiner* — Lauren R Bell
(74) *Attorney, Agent, or Firm* — J.C. Patents

(57) ABSTRACT

A light emitting device with reduced forward voltage $V_f$ by utilizing the excellent lateral conduction of two-dimensional electron gas (2DEG) and two-dimensional hole gas (2DHG) structure and, more specifically, by improving the vertical conduction of 2DEG and 2DHG structure by means of vertical conductive passages formed in 2DEG and 2DHG structure. The conductive passages are formed via discontinuities in 2DEG and 2DHG structure. The discontinuities can be in the form of openings by etching 2DEG or 2DHG structure, or in the form of voids by growing 2DEG or 2DHG structure on a rough surface via epitaxy facet control. The discontinuities can be formed by vertical displacement of 2DEG structure. A method is provided for manufacturing a light emitting device with reduced forward voltage same.

13 Claims, 13 Drawing Sheets

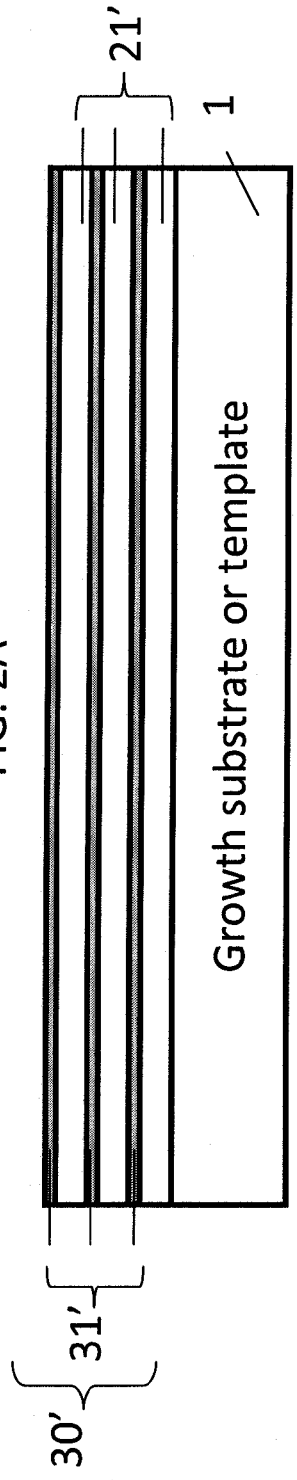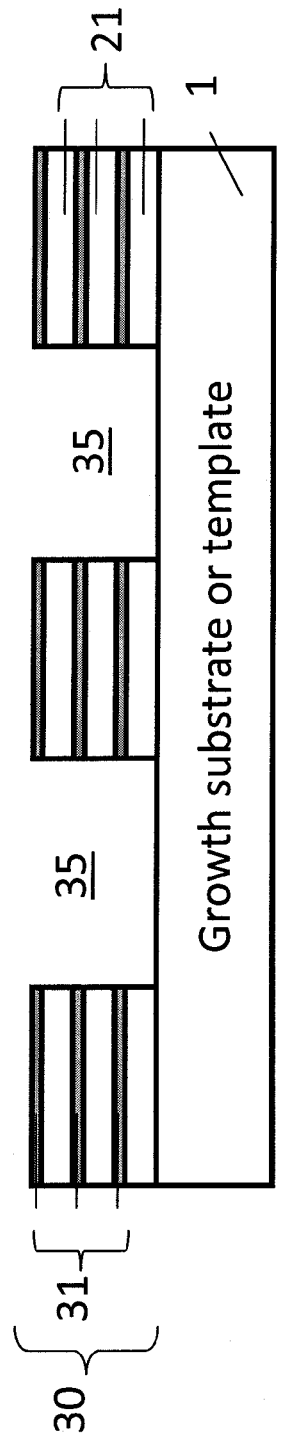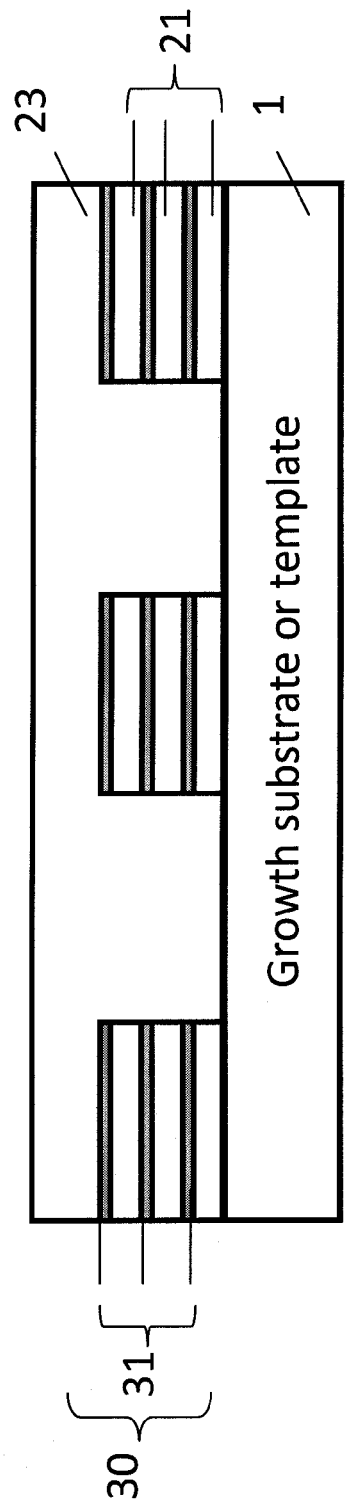

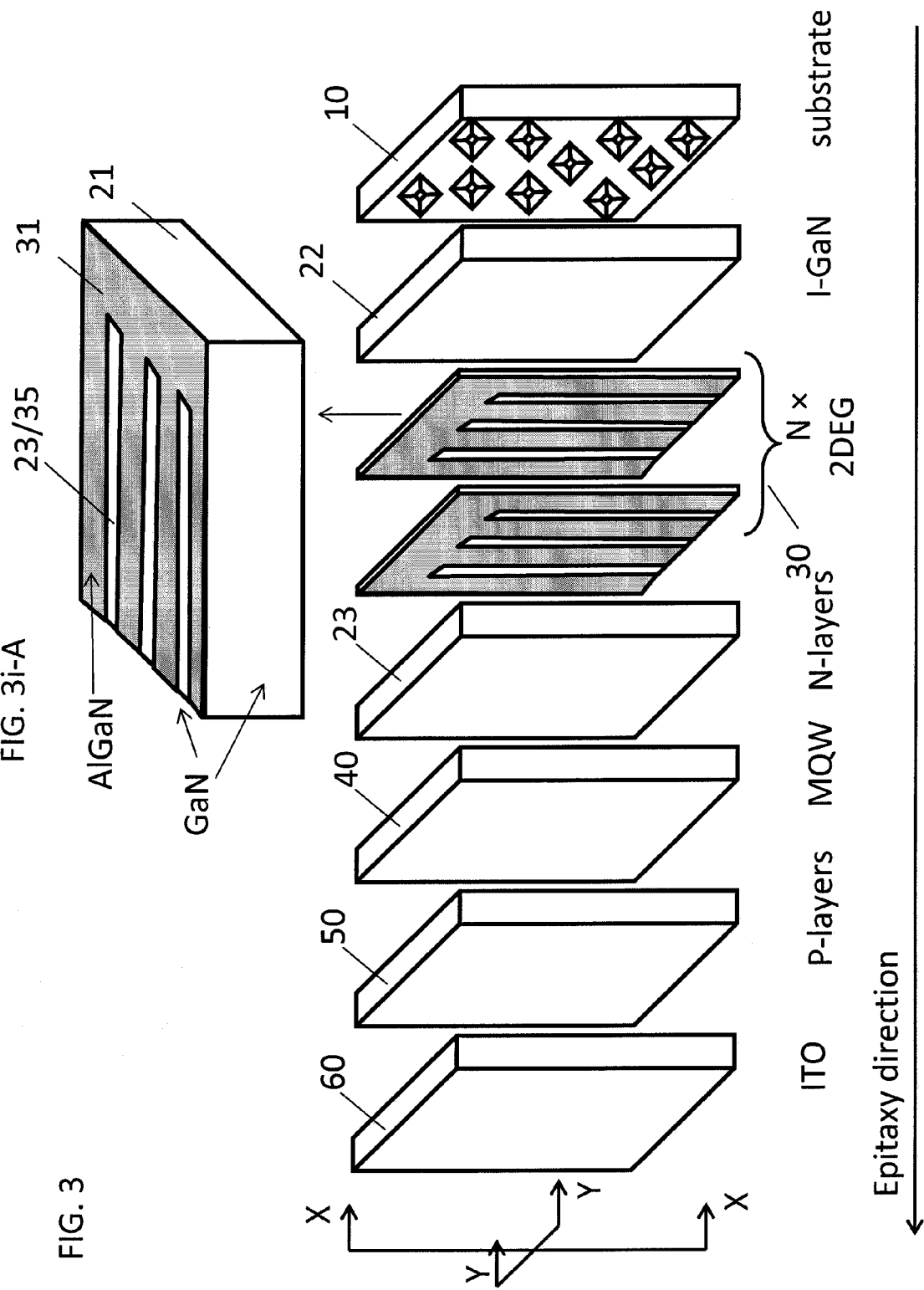

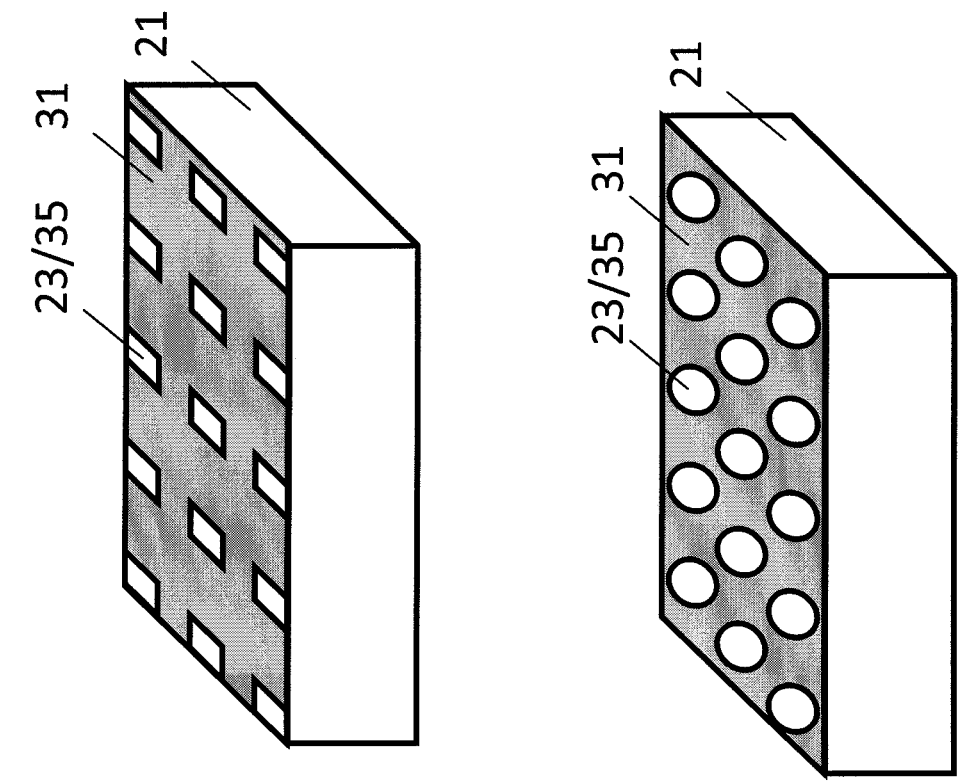
FIG. 3i-B
FIG. 3i-C

LIGHT-EMITTING DEVICE WITH LOW FORWARD VOLTAGE AND METHOD FOR FABRICATING THE SAME

1. FIELD OF THE INVENTION

The present invention relates in general to light-emitting devices with low forward voltage, more particularly to III-nitride light-emitting devices with low forward voltage.

2. DESCRIPTION OF THE RELATED ART

III-nitride based light-emitting devices such as light-emitting diodes (LEDs) are widely acknowledged as the next generation light sources and are currently emerging as strong replacement of incandescent and fluorescent lamps in general lighting. For example, the field of interest uses Cerium-doped yttrium aluminum garnet (YAG:Ce) phosphor to convert InGaN multiple-quantum-well (MQW) LED's blue emission into white light, yielding commercial white light LEDs with luminous efficacies in the range of 80-110 μm/W. The R&D luminous efficacy record reported so far by Nichia has reached 183 lm/W (Y. Narukawa et al, J. Phys. D: Appl. Phys. 43, 354002 (2010).).

Luminous efficacy (LE) is the product of blue LED's wall-plug-efficiency (WPE) and phosphor's light down-conversion efficiency (PCE), i.e.:

$$LE = WPE \times PCE \quad (1)$$

An LED's wall-plug-efficiency is the ratio of the LED's optical radiant power over the injected electric power to the LED, i.e. $WPE = P_{optical}/P_{electric}$. It is more useful to express WPE as:

$$WPE = EQE \times \frac{V_{ph}}{V_f} = EQE \times \frac{1}{V_f} \times \frac{1242.4}{\lambda_p} \quad (2)$$

where $V_{ph}$ is photon's equivalent voltage when photon's energy is expressed in eV; $V_f$ is the LED's forward voltage; EQE is the LED's external quantum efficiency, and $\lambda_p$ is LED's peak wavelength (in nanometer). EQE is the ratio of extracted phonons out of the LED over the injected electrons into the LED.

And, $$EQE = IQE \times LEE \quad (3)$$

where IQE is the ratio of generated phonons in the LED over the injected electrons into the LED, and LEE is the ratio of photons extracted out of the LED over the photons generated in the LED.

Phosphors' down-conversion efficiency (PCE) can reach 260 lm/W according to Nichia's published results (Y. Narukawa et al, J. Phys. D: Appl. Phys. 43, 354002 (2010).). Therefore, to approach a luminous efficacy of 150 lm/W for a white LED, one needs a blue LED with wall-plug-efficiency not less than 57.7%. It is manifested in equation (2) that the difference of WPE and EQE comes from the fact that not all the voltage biased on the LED contributes to light generation. As a result, to maximize luminous efficacy, one has to minimize LED's forward voltage $V_f$.

A straightforward method to reduce $V_f$ is to use heavily doped n-type and p-type layers in the LED structure, aiming at reducing series resistances of the LED. In the prior art, heavily Si-doped GaN, up to $2 \times 10^{19}$ cm$^{-3}$, has been employed in the U.S. Pat. Nos. 6,630,692 and 7,026,653. It is noted that such a high doping level, much higher than the Mott transition doping level ($2 \times 10^{18}$ cm$^{-3}$ for GaN), is detrimental, in one hand to the material quality hence the LED's IQE, on the other hand to the light extraction efficiency because of increased light absorption due to heavy doping. A compromised approach, modulation doping of GaN is disclosed in the U.S. Pat. No. 7,700,384. Modulation doped GaN consists of multiple thin heavily doped GaN layers separated by thin undoped or slightly doped GaN layers.

It has also been acknowledged by the field of interest that modulation doped AlGaN/GaN structure can provide two-dimensional high density carrier gas forming highly conductive channel. For example, U.S. Pat. No. 6,878,593 discloses the formation of two-dimensional electron gas (2DEG) at the AlGaN/GaN interface, the content of which is hereby incorporated by reference in its entirety. J. Hertkorn et al reported two-dimensional hole gas (2DHG) at the p-type doped p-(AlGaN/GaN) interface (J. Hertkorn et al, Highly conductive modulation doped composition graded p-AlGaN/AlN/GaN multiheterostructures grown by metalorganic vapor phase epitaxy, J. Appl. Phys. 106, 013720 (2009)), the content of which is hereby incorporated by reference in its entirety.

However, the role of 2DEG and 2DHG in reducing LED's forward voltage $V_f$ is limited because the electrons or holes in 2DEG and 2DHG are tightly confined in the interface region of the 2DEG or 2DHG structure.

3. SUMMARY OF THE INVENTION

The present invention is directed to a light emitting device with reduced forward voltage $V_f$ by utilizing the excellent lateral conduction of two-dimensional electron gas (2DEG) and two-dimensional hole gas (2DHG) structure and, more specifically, by improving the vertical conduction of 2DEG and 2DHG structure by means of vertical conductive passages formed in 2DEG and 2DHG structure. The conductive passages are formed via discontinuities in 2DEG and 2DHG structure. The discontinuities can be in the form of openings by etching 2DEG or 2DHG structure, or in the form of voids by growing 2DEG or 2DHG structure on a rough surface via epitaxy facet control. The discontinuities can be formed by vertical displacement of 2DEG structure. The discontinuities can also be in other suitable forms as long as the discontinuities expose 2DEG or 2DHG channel and allow conductive material to be filled therein so as to form a conductive passage. The present invention is directed to method for fabricating a light emitting device with reduced forward voltage $V_f$.

A 2DEG structure comprises one or more pairs of n-type GaN layers and n-type AlGaN layers, each pair of n-type GaN layer and n-type AlGaN layer is so selected that an interface thereof defines a 2DEG channel. The discontinuities are formed in the 2DEG structure to expose 2DEG channel of the 2DEG structure, and n-type conductive material is filled into the discontinuities to form conductive passages electrically connecting the 2DEG channel to an LED structure. The conductive material can be an integral part of the n-type layer in an LED structure grown thereon, or a separate conductive layer with better electric conductivity than the n-type layer in the LED structure partially or fully filling the discontinuities and the n-type layer is formed on the separate conductive layer with ohmic contact formation. The discontinuities can be in the form of openings in 2DEG structure formed by etching the 2DEG structure, or can be in the form of voids in the 2DEG structure formed by growing the 2DEG structure on a rough surface via epitaxy facet control. The discontinuities can be formed by vertical displacement of 2DEG structure. The discontinuities can also be in other suitable forms as long as the discontinuities expose 2DEG channel and allow conductive material to be filled therein and to directly contact the 2DEG so as to form a conductive passage between the 2DEG channel and an n-type layer in the active region of an LED structure.

A 2DHG structure comprises one or more pairs of p-type GaN layers and p-type AlGaN layers, each pair of p-type GaN layer and p-type AlGaN layer is so selected that an interface thereof defines a 2DHG channel. Openings are formed in a 2DHG structure to expose the 2DHG channel, and p-type conductive material is filled into the openings to form conductive passages electrically connecting the 2DHG channel to an LED structure, for example, a p-type protection layer of the LED structure.

In some embodiment, by composition change, at least one 2DEG channel is formed below and/or within n-type layers of an LED structure, wherein the 2DEG channel discontinues at least at one position, allowing an n; type layer to connect with the 2DEG channel at the 2DEG channel discontinuous point.

In some embodiment, by composition change, at least one 2DHG channel is formed below and/or within p-type layers of a LED structure, wherein the 2DHG channel discontinues at least at one position, allowing a p-type layer to connect with the 2DHG channel at the 2DHG channel discontinuous point.

In some embodiment, by composition change, at least one 2DEG channel is formed below and/or within n-type layers of a LED structure, wherein the 2DEG channel discontinues at least at one position, allowing an n-type layer to connect with the 2DEG channel at the 2DEG channel discontinuous point; and by composition change, at least one 2DHG channel is formed below and/or within p-type layers of a LED structure, wherein the 2DHG channel discontinues at least at one position, allowing a p-type layer to connect with the 2DHG channel at the 2DHG channel discontinuous point.

In some embodiments, the 2DEG and/or 2DHG channels discontinue at more than one position, wherein the 2DEG and/or 2DHG discontinuous positions form a regular or irregular, one-dimensional or two-dimensional patterns.

In some embodiments, continuous 2DEG or 2DHG channels are formed during epitaxial growth. Then 2DEG or 2DHG channel discontinuities are formed ex-situ by known means in the field of interest. Then regrowth is performed to let n-type layer or p-type layer to connect with 2DEG or 2DHG channels via the discontinuous points, respectively.

In some embodiments, the top surface of a substrate or a template consists of two sets vertically displaced sub-surfaces or recesses/protrusions. 2DEG channels grown on said substrates or templates possess in-situ formed discontinuities.

In some embodiments, the growth starting surface for formation of 2DEG or 2DHG channels is roughened by known methods, so that as-formed 2DEG or 2DHG channels possess discontinuities upon epitaxial growth.

In some embodiments, LEDs are processed with more than one mesa, wherein mesa one is formed by removing part of p-layer, active-region, and a small portion of n-type layer, and mesa two is formed relative to mesa one by additionally removing a portion of n-type layer; and a p-contact pad is formed on mesa one, and stepped n-contact and n-contact pad are formed on mesa two.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 2A-2D illustrate the fabrication of 2DEG or 2DHG channels with openings in the 2DEG or 2DHG channel plane, wherein conductive layers electrically access the 2DEG or 2DHG channels via the openings according to one aspect of the present invention.

FIG. 3 illustrates the epitaxial process flow of an LED structure applying 2DEG channels according to one aspect of the present invention.

FIG. 3*i*-A illustrates the perspective view of a 2DEG channel with finger-shaped openings according to an embodiment of the present invention.

FIG. 3*i*-B illustrates the perspective view of a 2DEG channel with two-dimensional square lattice structure type of openings according to an embodiment of the present invention.

FIG. 3*i*-C illustrates the perspective view of a 2DEG channel with two-dimensional triangle lattice structure type of openings according to an embodiment of the present invention.

Figure 4A:
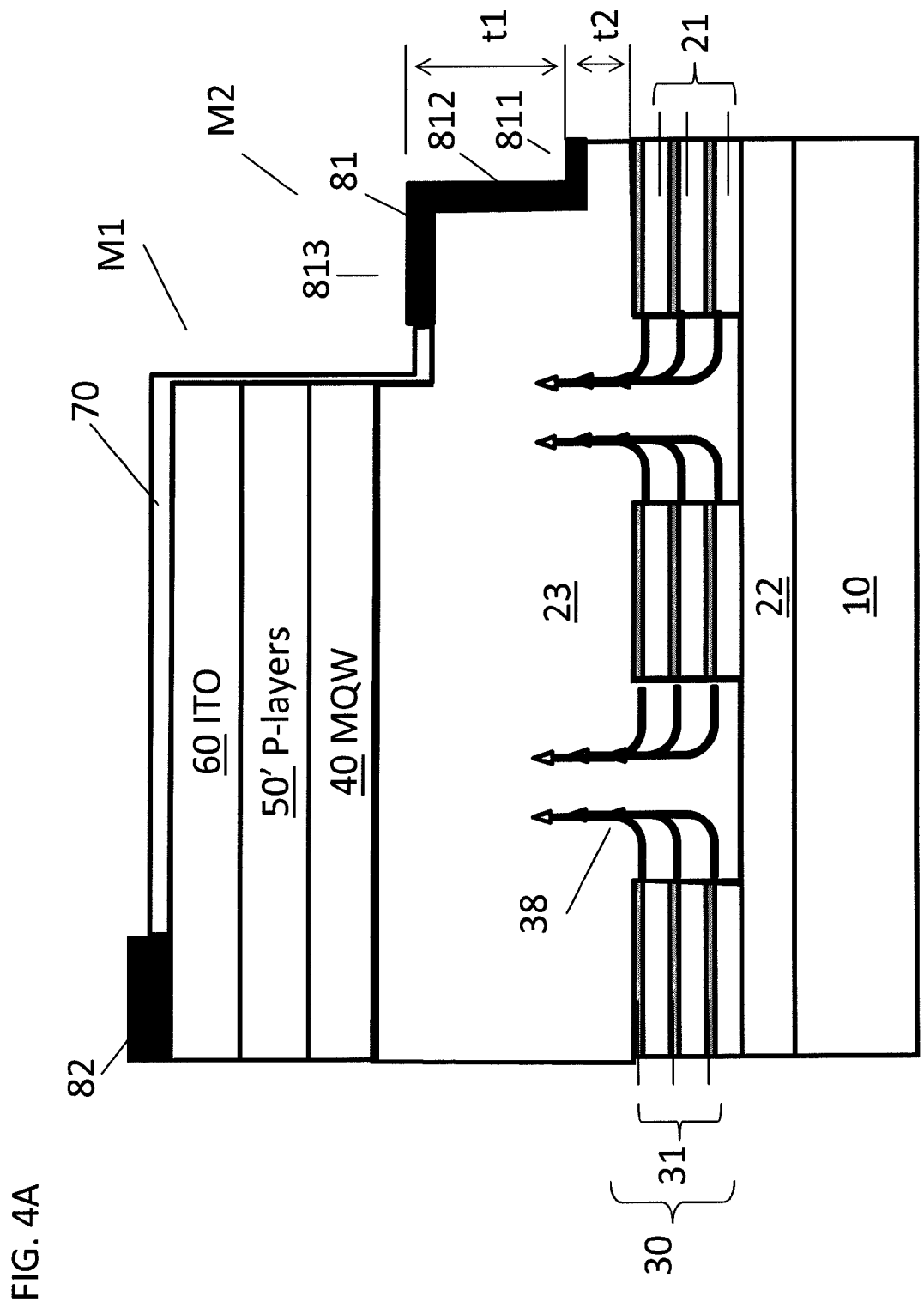

FIG. 4A illustrates the cross-sectional structure of an embodiment LED utilizing multiple 2DEG channels with in-plane openings and stepped n-contact according to one aspect of the present invention.

Figure 4B:
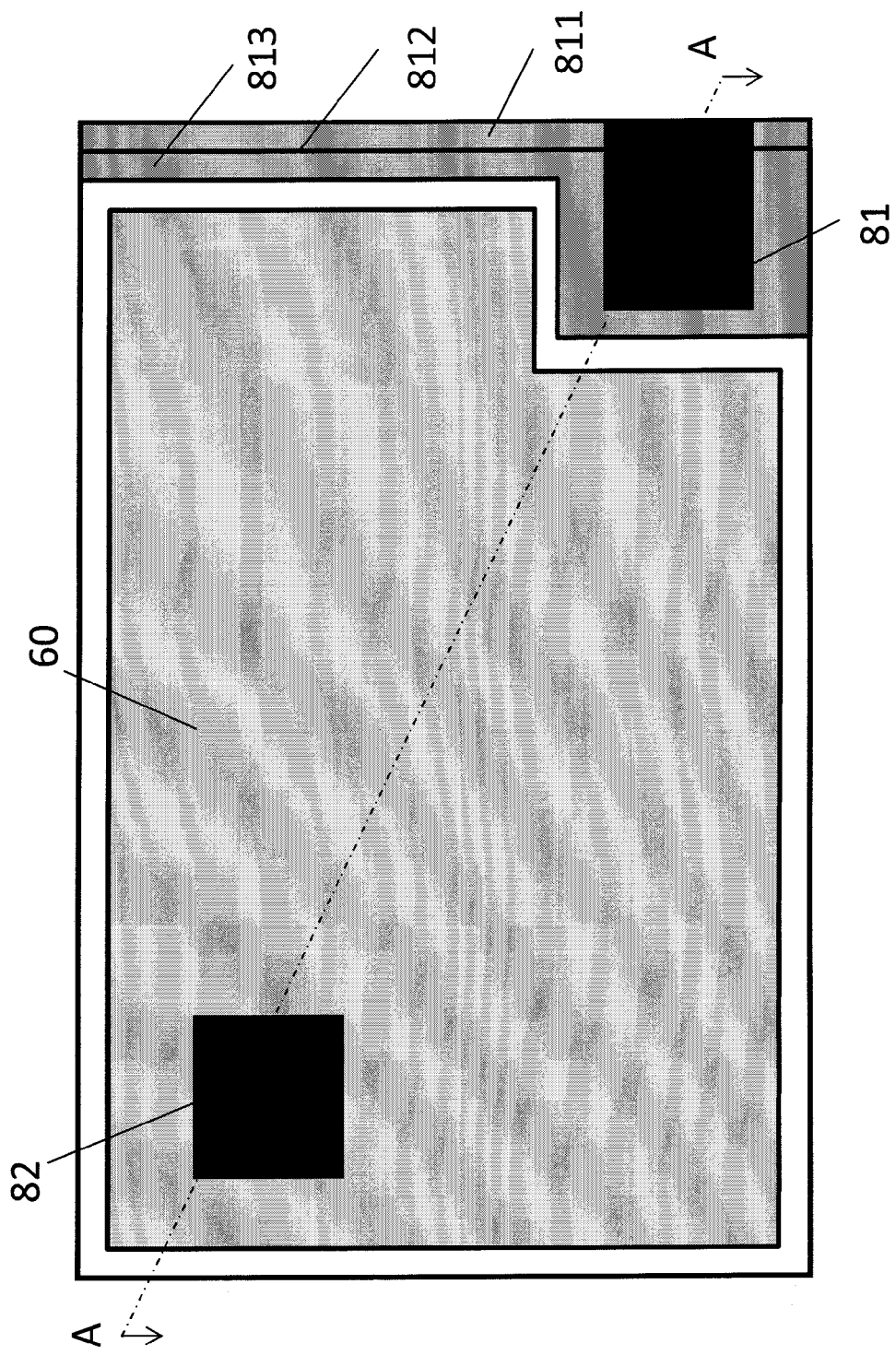

FIG. 4B illustrates the plan-view of FIG. 4A, showing the stepped n-contact.

Figure 5:
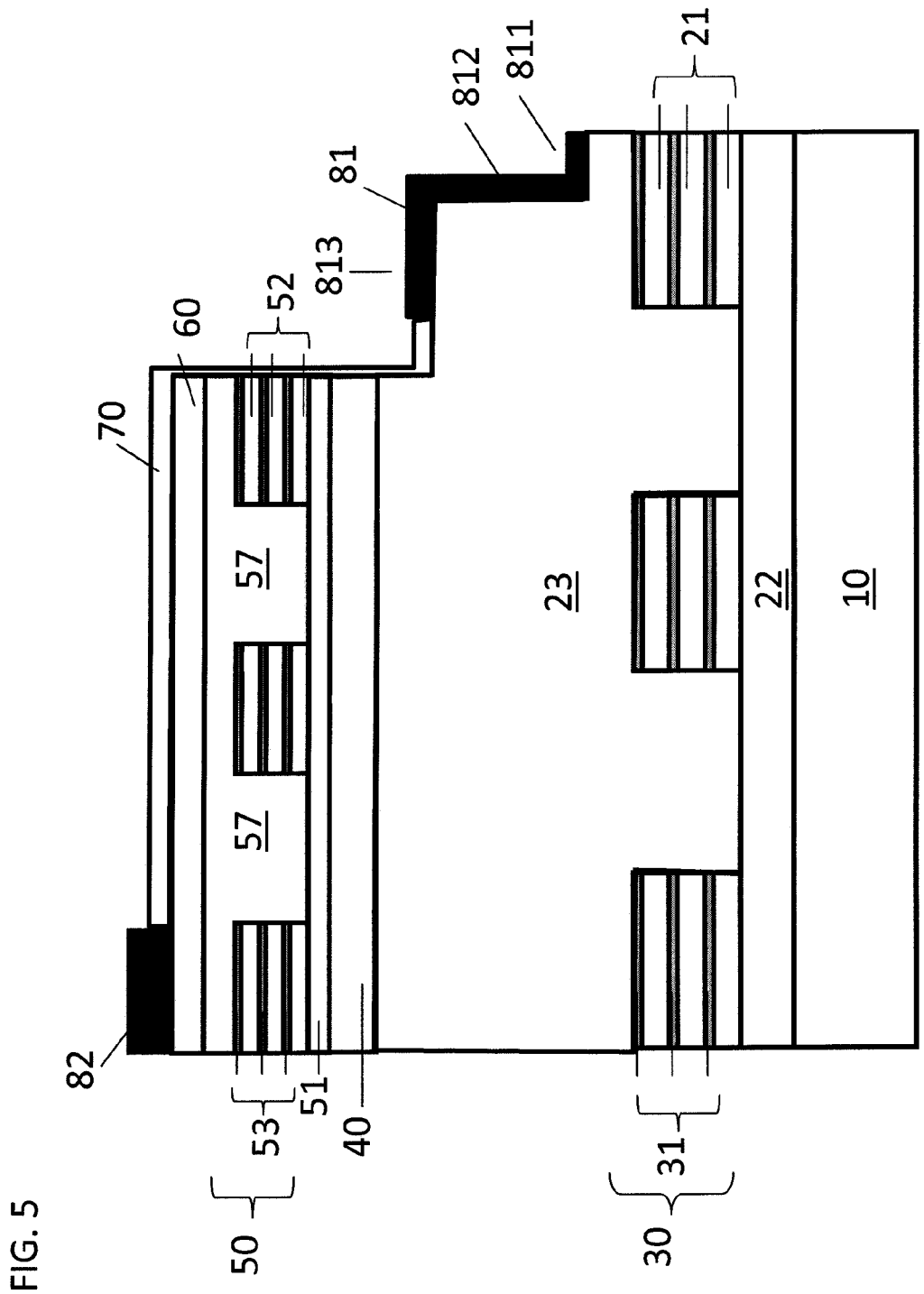

FIG. 5 illustrates the cross-sectional structure of an embodiment LED utilizing multiple 2DEG and 2DHG channels with in-plane openings and stepped n-contact according to one aspect of the present invention.

Figure 6A:
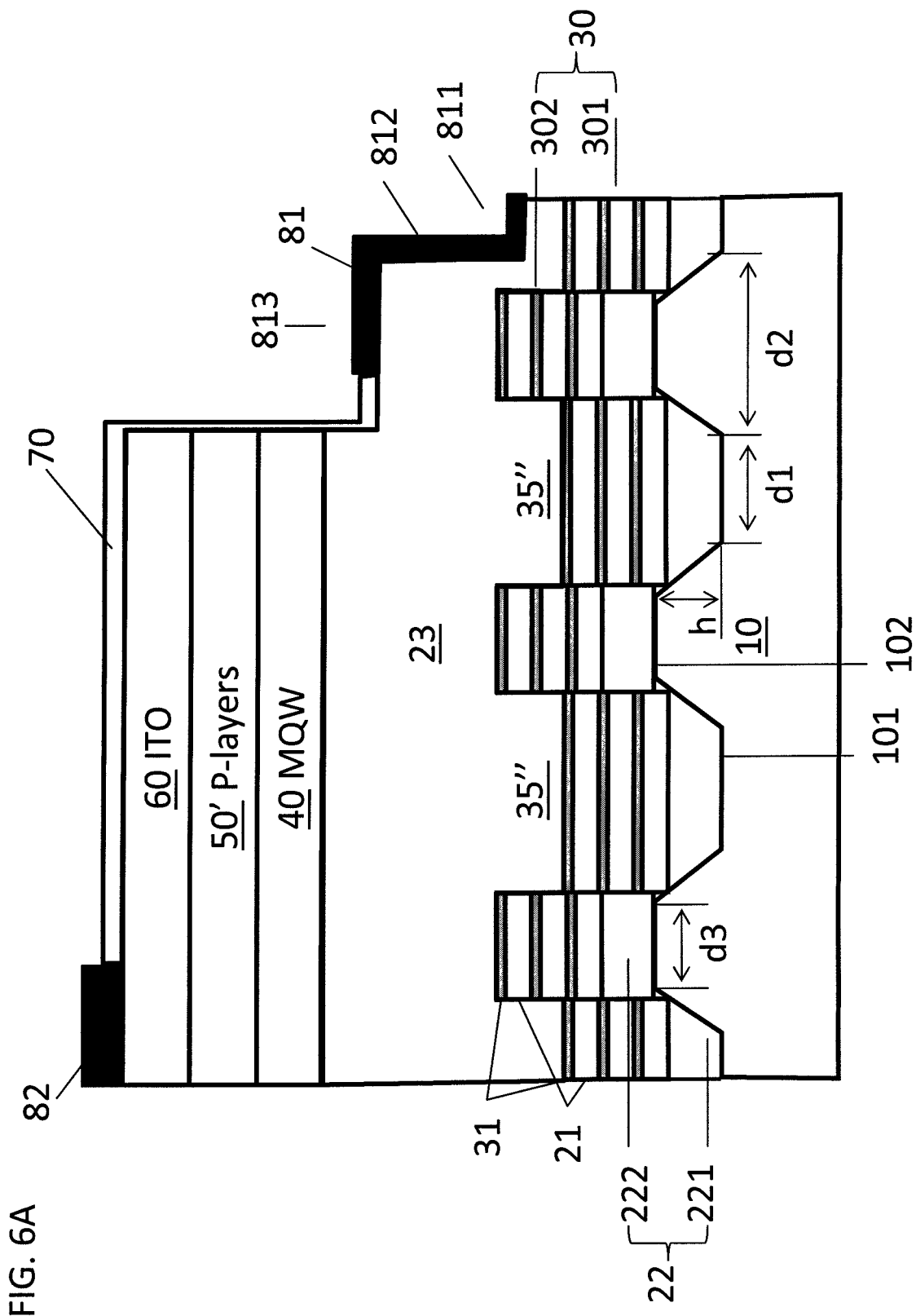

FIG. 6A illustrates the cross-sectional structure of an embodiment LED utilizing multiple 2DEG channels with in-plane vertical displacement and stepped n-contact according to one aspect of the present invention.

Figures 6B, 6C:
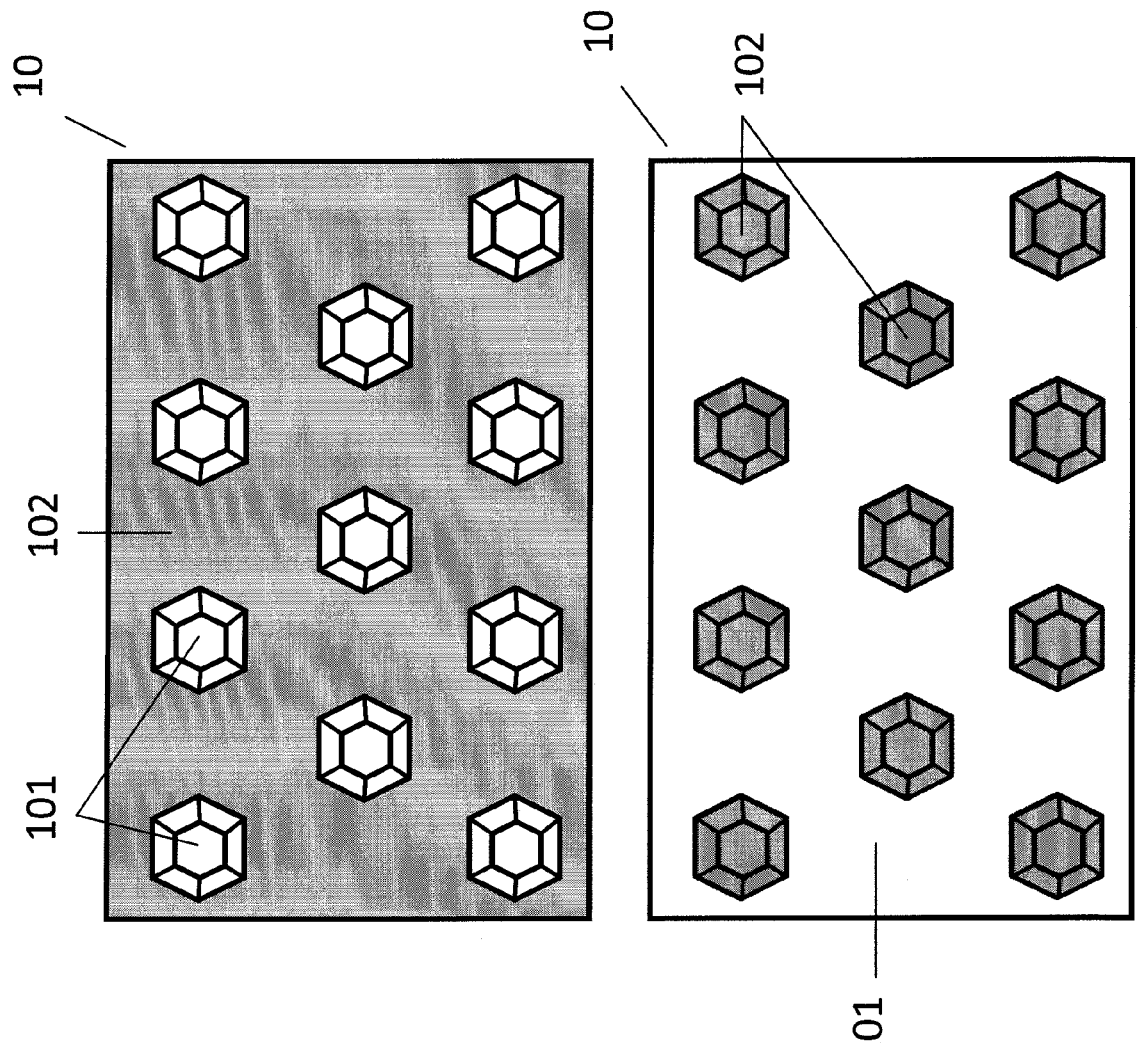

FIG. 6B illustrates plan-view of the substrate or template used in FIG. 6A.

FIG. 6C illustrates plan-view of the substrate or template used in FIG. 6A.

Figure 7:
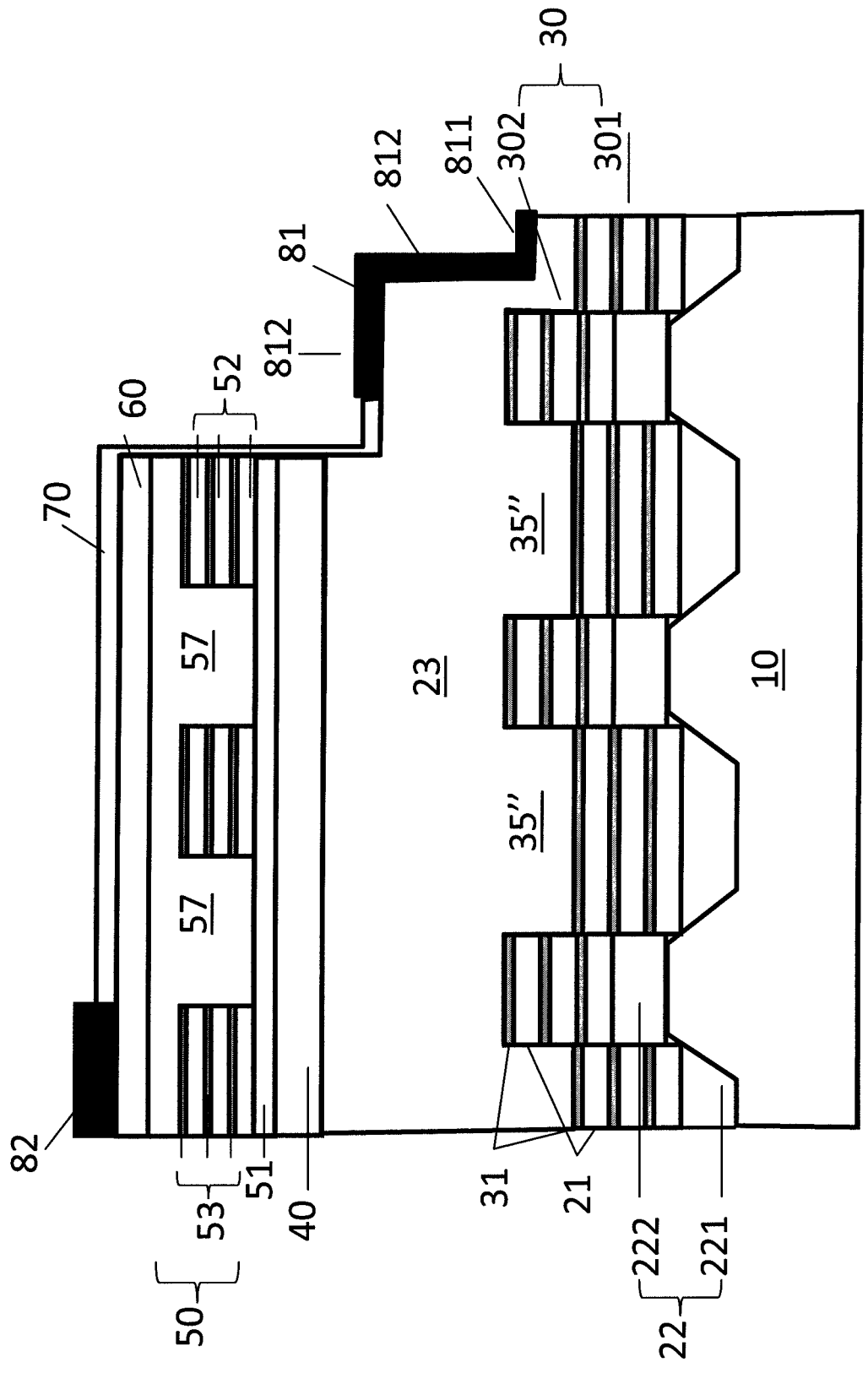

FIG. 7 illustrates the cross-sectional structure of an embodiment LED utilizing multiple 2DEG and 2DHG channels with in-plane openings and vertical displacement, respectively, and stepped n-contact according to one aspect of the present invention.

Figure 8:
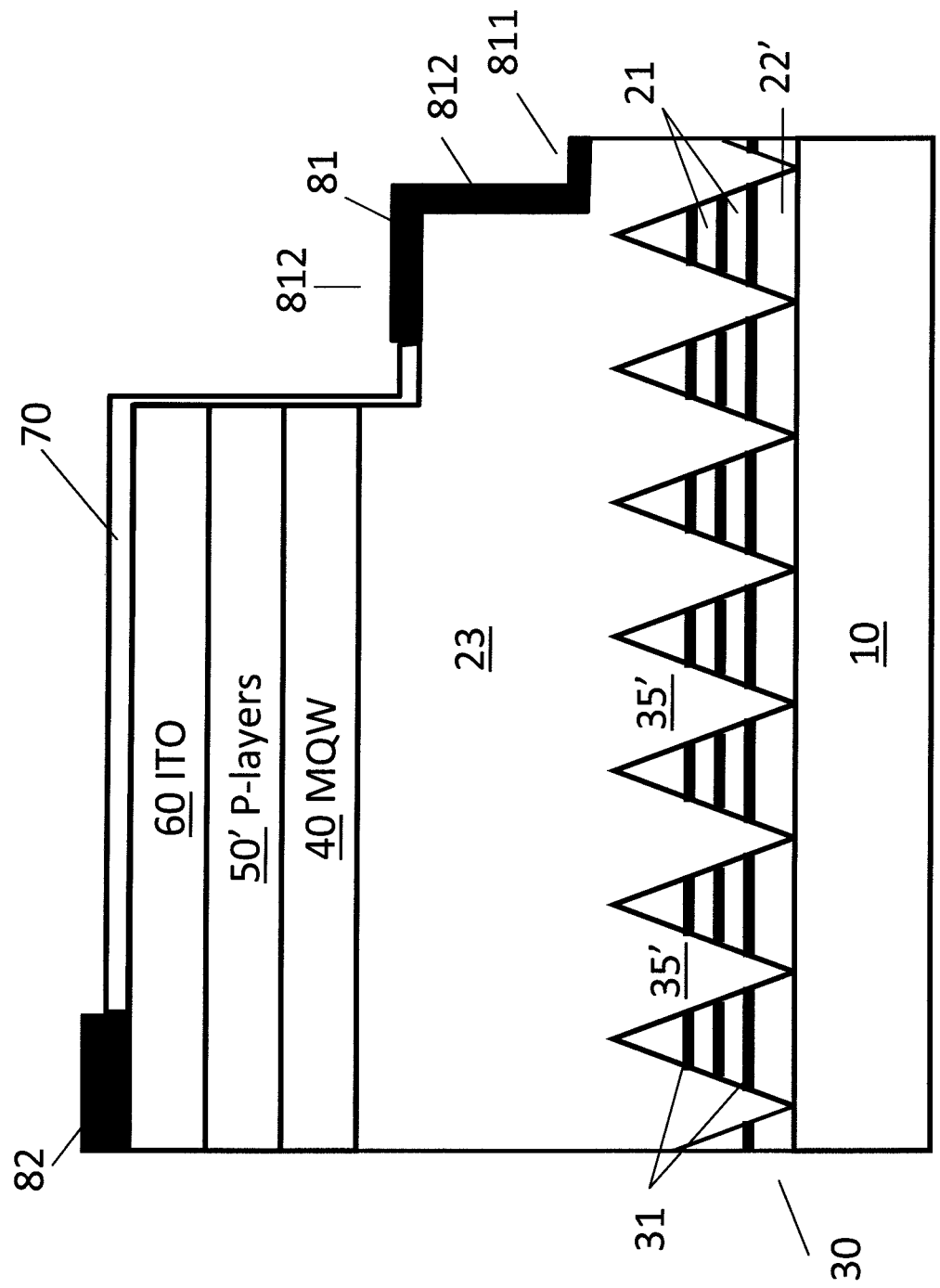

FIG. 8 illustrates the cross-sectional structure of an embodiment LED utilizing multiple 2DEG channels with in-plane voids formed through rough surface and stepped n-contact according to one aspect of the present invention.

5. DETAILED DESCRIPTION OF EMBODIMENTS

The present invention comprises at least the following items:

Item 1. A light-emitting device comprising:
a two-dimensional electron gas (2DEG) structure;
an n-type layer formed on the two-dimensional electron gas structure;

a p-type layer; and an active region sandwiched between the n-type layer and the p-type layer, wherein the two-dimensional electron gas structure comprises one or more pairs of n-type GaN layers and n-type AlGaN layers, each pair of n-type GaN layer and n-type AlGaN layer is so selected that an interface thereof defines a 2DEG channel, a plurality of discontinuities are formed in the two-dimensional electron gas structure exposing the 2DEG channel, and the n-type layer is formed on the two-dimensional electron structure and in electric contact with the 2DEG channel through the discontinuities.

Item 2. The light-emitting device of item 1, further comprising:

a p-type protection layer formed on the active region; and a two-dimensional hole gas structure formed on the p-type protection layer, wherein the two-dimensional hole gas structure comprises one or more pairs of p-type GaN layers and p-type AlGaN layers, each pair of p-type GaN layer and p-type AlGaN layer is so selected that an interface thereof defines a 2DHG channel, and a plurality of openings are formed in the two-dimensional hole gas structure exposing the 2DHG channel and the p-type protection layer, and the p-type layer is formed on the two-dimensional hole gas structure filling the openings so as to electrically connect the 2DHG channel to the p-type protection layer through the openings.

Item 3. The light-emitting device of item 1, wherein the n-type layer fills the discontinuities and is in direct contact with the 2DEG channel.

Item 4. The light-emitting device of item 1, further comprising a conductive layer partially or fully filling the discontinuities and in direct contact with the 2DEG channel, wherein the conductive layer has a higher conductivity than the n-type layer, and the n-type layer is electrically connected to the 2DEG channel through the conductive layer.

Item 5. The light-emitting device of item 4, wherein the conductive layer is made of Titanium nitride, Zirconium nitride, Hafnium nitride, Vanadium nitride, Niobium nitride, Tantalum nitride, Scandium nitride, Yttrium nitride, Chromium nitride, Molybdenum nitride, Tungsten nitride.

Item 6. The light-emitting device of item 1, further comprising:

a p-contact electrically connected to the p-layer; and an n-contact electrically connected to the n-type layer, wherein the n-type layer has a stepped structure with an upper step surface and a lower step surface being connected by a sidewall, and the n-contact is conformably formed on the upper step surface, the lower step surface and the sidewall of the stepped structure of the n-type layer.

Item 7. The light-emitting device of item 1, wherein the n-type AlGaN layer of the two-dimensional electron gas structure is Si-doped or intrinsic AlGaN layer and has a composition of $Al_xGa_{1-x}N$, where $0.10 \leq x \leq 0.40$.

Item 8. The light-emitting device of item 1, wherein the n-type GaN layer of the two-dimensional electron gas structure is made of Si-doped or intrinsic GaN.

Item 9. The light-emitting device of item 1, wherein the n-type layer is made of Si-doped GaN, or Si-doped $In_yGa_{1-y}N$ where $0.01 \leq y \leq 0.10$, or Si-doped $Al_xGa_{1-x}N$ where $0.01 \leq x \leq 0.10$.

Item 10. The light-emitting device of item 2, wherein the p-type AlGaN layer of the two-dimensional hole gas structure is made of Mg-doped AlGaN or intrinsic AlGaN, and has a composition of $Al_xGa_{1-x}N$, where $0.10 \leq x \leq 0.30$.

Item 11. The light-emitting device of item 1, wherein the 2DEG channel has a sheet electron density more than $10^{13}$ $cm^{-2}$.

Item 12. The light-emitting device of item 2, wherein the 2DHG channel has a sheet hole density more than $10^{13}$ $cm^{-2}$.

Item 13. The light-emitting device of any one of items 1-12, wherein the discontinuities are in the form of openings formed in the two-dimensional electron gas structure and exposing at least one 2DEG channel.

Item 14. The light-emitting device of any one of items 1-12, wherein the discontinuities are in the form of voids formed in the two-dimensional electron gas structure by growing the two-dimensional electron gas structure on a rough surface via epitaxy facet control and the voids expose at least one 2DEG channel.

Item 15. The light-emitting device of any one of items 1-12, wherein the discontinuities are in the form of vertical displacement of the two-dimensional electron gas structure, wherein the light-emitting device comprises a substrate having an upper surface with recesses or protrusions, the two-dimensional electron gas structure is formed over the upper surface of the substrate and vertically displaced in accordance with the recesses or protrusions of the upper surface of the substrate so as to form a plurality of upper portions and a plurality of lower portions, at least some of the 2DEG channels in the upper portions are exposed and in electrical connection with the n-type layer.

Item 16. A method of fabricating a light-emitting device comprising:

providing a substrate;

forming a two-dimensional electron gas (2DEG) structure over the substrate;

forming an n-type layer over the two-dimensional electron gas structure;

forming an active region on the n-type layer; and forming a p-type layer on the active region, wherein the step of forming the two-dimensional electron gas structure comprises forming one or more pairs of n-type GaN layers and n-type AlGaN layers, each pair of n-type GaN layer and n-type AlGaN layer is so selected that an interface thereof defines a 2DEG channel; and forming a plurality of discontinuities in the two-dimensional electron gas structure exposing the 2DEG channel; and wherein the n-type layer is in electrical contact with the 2DEG channel through the discontinuities.

Item 17. The method of item 16, wherein the step of forming the n-type layer comprises:

depositing the n-type layer on the two-dimensional electron gas structure to fills the discontinuities so that the n-type layer is in direct contact with the 2DEG channel.

Item 18. The method of item 16, further comprising:

partially and fully filling a conductive layer having a better conductivity than the n-type layer into the discontinuities so that the conductive layer is in direct contact with the 2DEG channel; then depositing the n-type layer on the conductive layer and the two-dimensional electron gas structure to fill the openings.

Item 19. The method of item 18, wherein the conductive layer is made of Titanium nitride, Zirconium nitride, Hafnium nitride, Vanadium nitride, Niobium nitride, or Tantalum nitride.

Item 20. The method of item 16, further comprising:

forming a p-type protection layer on the active region;

forming a two-dimensional hole gas (2DHG) structure on the p-type protection layer, wherein the two-dimensional hole gas structure comprises one or more pairs of p-type GaN layers and p-type AlGaN layers, each pair of p-type GaN layer and p-type AlGaN layer is so selected that an interface thereof defines a 2DHG channel;

forming a plurality of openings in the two-dimensional hole gas structure exposing the 2DHG channel and the p-type protection layer; and forming the p-type layer on the two-dimensional hole gas structure to fill the openings, so that the p-type layer electrically connects the 2DHG channel to the p-type protection layer through the openings.

Item 21. The method of item 16, further comprising:

etching the p-type layer, the active region, and the n-type layer to form a stepped structure with an upper step surface and a lower step surface being connected by a sidewall in the n-type layer; and forming an n-contact conformably on the upper step surface, the lower step surface and the sidewall of the stepped structure of the n-type layer.

Item 22. The method of item 16, wherein the continuities are in the form of openings in the two-dimensional electron gas structure and the openings are formed by etching the two-dimensional electron gas structure before forming the n-type layer.

Item 23. The method of item 16, wherein the discontinuities are in the form of voids in the two-dimensional electron gas structure, and the voids are formed by:

depositing a GaN layer on the substrate under conditions favoring three-dimensional growth so as to form a GaN layer with a rough upper surface containing islands of an average height in the range of 0.4-0.6 µm and an average base size in the range of 0.8-2 µm; and then forming the two-dimensional electron gas structure which comprises:

depositing an n-type GaN layer on the rough upper surface of the GaN layer to form an n-type GaN layer having a plurality of protruded portions respectively formed on tops of the islands and separated from each other;

depositing an n-type AlGaN layer on the n-type GaN layer to form an n-type AlGaN layer having a plurality of protruded portions on corresponding protruded portions of the n-type GaN layer, so that a plurality of corresponding protruded portions of the pair of the n-type GaN layer and the n-type AlGaN layer are formed, and the voids exposing the 2DEG channel are formed between the corresponding protruded portions.

Item 24. The method of item 23, further comprising:

forming a nitride buffer layer on the substrate;

heating the substrate to re-crystallize the buffer layer to generate a rough upper surface; and depositing the GaN layer on the rough upper surface of the re-crystallized buffer layer under conditions favoring three-dimensional growth so as to form the GaN layer with a rough upper surface.

Item 25. The method of item 16, wherein the discontinuities are formed by vertical displacement of the two-dimensional electron gas structure, and the vertical displacement is formed by:

providing a substrate having an upper surface with recesses or protrusions;

forming a two-dimensional electron gas structure over the upper surface of the substrate, so that two-dimensional electron gas structure is vertically displaced in accordance with the recesses or protrusions on the upper surface of the substrate so as to form a plurality of upper portions and a plurality of lower portions, at least some of the 2DEG channels in the upper portions are exposed by recesses formed between the upper portions and the corresponding lower portions of the two-dimensional electron gas structure and are in electrical connection with the n-type layer.

Item 26. The method of item 25, wherein the step of forming the n-type layer comprises:

filling the n-type layer into the recesses formed between the upper portions and the corresponding lower portions of the two-dimensional electron gas structure, so that the n-type layer is in direct contact with said at least some of the 2DEG channels.

Item 27. The method of item 25, further comprising:

partially and fully filling a conductive layer having a better conductivity than the n-type layer into the recesses formed between the upper portions and the corresponding lower portions of the two-dimensional electron gas structure, so that the conductive layer is in direct contact with said at least some of the 2DEG channels; and depositing the n-type layer on the conductive layer and the two-dimensional electron gas structure.

Item 28. The method of item 27, wherein the conductive layer is made of Titanium nitride, Zirconium nitride, Hafnium nitride, Vanadium nitride, Niobium nitride, Tantalum nitride, Scandium nitride, Yttrium nitride, Chromium nitride, Molybdenum nitride, or Tungsten nitride.

Item 29. A light-emitting device comprising:

a substrate having an upper surface with recesses or protrusions;

a two-dimensional electron gas structure formed over the upper surface of the substrate;

an n-type layer formed on the two-dimensional electron gas (2DEG) structure;

a p-type layer; and an active region sandwiched between the n-type layer and the p-type layer, wherein the two-dimensional electron gas structure comprises one or more pairs of n-type GaN layers and n-type AlGaN layers, each pair of n-type GaN layer and n-type AlGaN layer is so selected that an interface thereof defines a 2DEG channel, the two-dimensional electron gas structure is vertically displaced in accordance with the recesses or protrusions on the upper surface of the substrate so as to form a plurality of upper portions and a plurality of lower portions, at least some of the 2DEG channels in the upper portions are in electrical contact with the n-type layer.

Item 30. The light-emitting device of item 29, wherein the n-type layer is in direct contact with said at least some of the 2DEG channels.

Item 31. The light-emitting device of item 29, further comprising a conductive layer partially or fully filling recesses between the upper portions and the corresponding lower portions of the two-dimensional electron gas structure, and the conductive layer being in direct contact with said at least some of the 2DEG channels, wherein the conductive layer has a higher conductivity than the n-type layer, and the n-type layer is electrically connected to said at least some of the 2DEG channels through the conductive layer.

Item 32. The light-emitting device of item 31, wherein the conductive layer is made of Titanium nitride, Zirconium nitride, Hafnium nitride, Vanadium nitride, Niobium nitride, Tantalum nitride, Scandium nitride, Yttrium nitride, Chromium nitride, Molybdenum nitride, or Tungsten nitride.

Item 33. A method of fabricating a light-emitting device comprising:

providing a substrate having an upper surface with recesses or protrusions;

forming a two-dimensional electron gas structure over the substrate;

forming an n-type layer on the two-dimensional electron gas structure;

forming an active region on the n-type layer; and forming a p-type layer on the active region, wherein the step of forming the two-dimensional electron gas structure comprises: forming one or more pairs of n-type GaN layers and n-type AlGaN layers over the upper surface of the substrate, each pair of n-type GaN layer and n-type AlGaN layer is so selected that an interface thereof defines a 2DEG channel, the two-dimensional electron gas structure is vertically displaced in accordance with the recesses or protrusions on the upper surface of the substrate so as to form a plurality of upper portions and a plurality of lower portions, at least some of the 2DEG channels in the upper portions are exposed by recesses formed between the upper portions and the corresponding lower portions of the two-dimensional electron gas structure and are in electrical contact with the n-type layer.

Item 34. A light-emitting device comprising:

an n-type layer;

a p-type layer;

a p-type protection layer;

an active region sandwiched between the n-type layer and the p-type protection layer; and a two-dimensional hole gas (2DHG) structure formed on the p-type protection layer, wherein the two-dimensional hole gas structure comprises one or more pairs of p-type GaN layers and p-type AlGaN layers, each pair of p-type GaN layer and p-type AlGaN layer is so selected that an interface thereof defines a 2DHG channel;

wherein a plurality of openings are formed in the two-dimensional hole gas structure exposing the 2DHG channel and the p-type protection layer, and the p-type layer is formed on the two-dimensional hole gas structure filling the openings and electrically connecting the 2DHG channel to the p-type protection layer.

Item 35. The light-emitting device of item 34, further comprising:

a p-contact electrically connected to the p-layer; and an n-contact electrically connected to the n-type layer, wherein the n-type layer has a stepped structure with an upper step surface and a lower step surface being connected by a sidewall, and the n-contact is conformably formed on the upper step surface, the lower step surface and the sidewall of the stepped structure of the n-type layer.

Item 36. The light-emitting device of item 34, wherein the n-type layer is made of Si-doped GaN, or Si-doped $In_yGa_{1-y}N$ where $0.01 \leq y \leq 0.10$, or Si-doped $Al_xGa_{1-x}N$ where $0.01 \leq x \leq 0.10$.

Item 37. The light-emitting device of item 34, wherein the p-type AlGaN layer of the two-dimensional hole gas structure is Mg-doped AlGaN or made of intrinsic AlGaN layer, and has a composition of $Al_xGa_{1-x}N$, where $0.10 \leq x \leq 0.30$.

Item 38. The light-emitting device of item 34, wherein the 2DHG channel has a sheet hole density more than $10^{13}$ cm$^{-2}$.

Item 39. The light-emitting device of item 34, wherein the p-type layer and the p-type protection are made of Mg-doped p-GaN, p-AlGaN, or p-InGaN, respectively, and have the same or different composition.

Figure 1A:
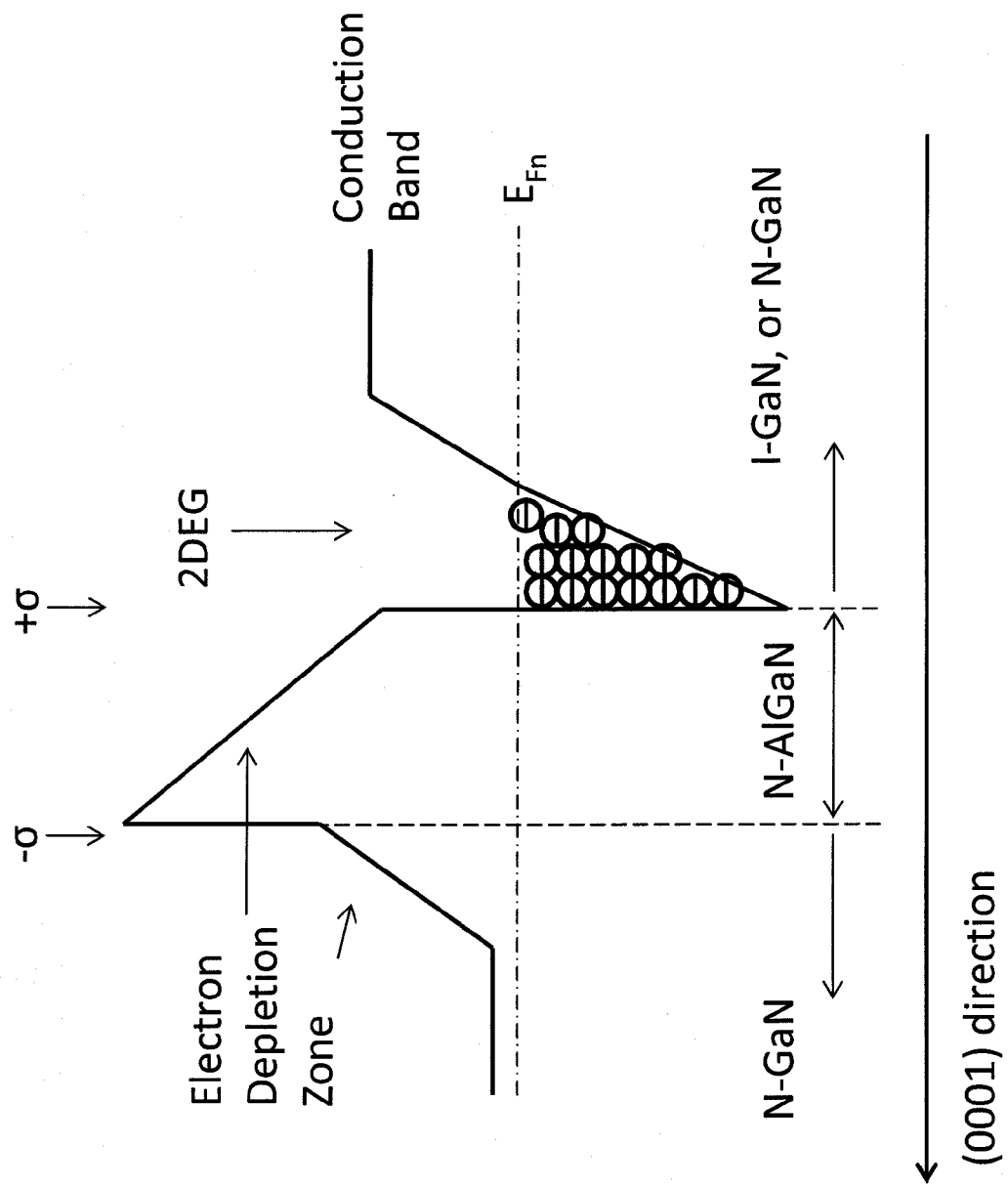
FIG. 1A illustrates the conduction band diagram of an n-type GaN/AlGaN/GaN tri-layer structure and the mechanism of 2DEG formation.
Figure 1B:
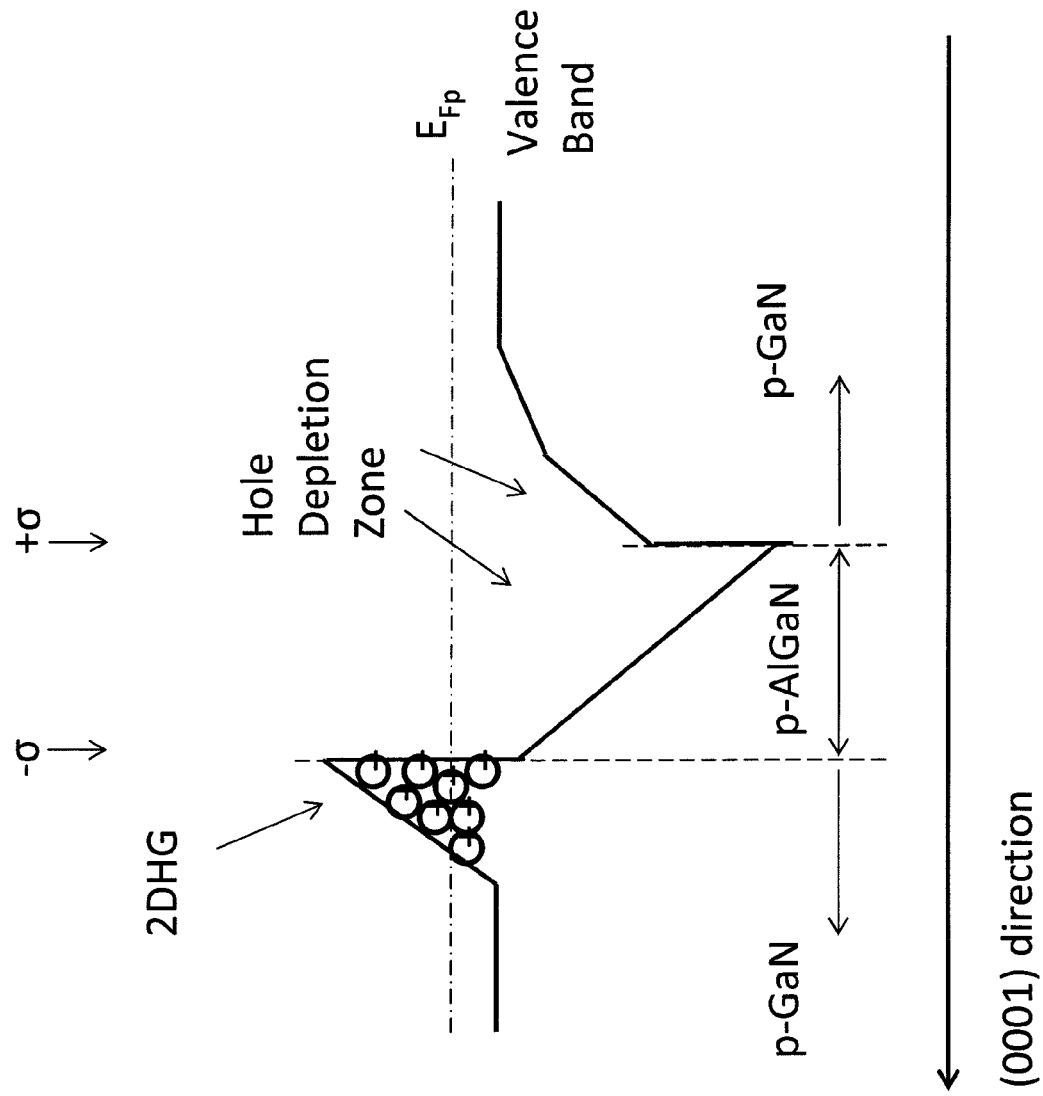
FIG. 1B illustrates the valence band diagram of a p-type GaN/AlGaN/GaN tri-layer structure and the mechanism of 2DHG formation.

The formation mechanism of two-dimensional electron gas (2DEG) and two-dimensional hole gas (2DHG) is schematically illustrated in FIG. 1A and FIG. 1B, respectively.

As shown in FIG. 1A, a GaN/AlGaN/GaN tri-layer structure consisting of n-GaN, n-AlGaN or intrinsic AlGaN, n-GaN or intrinsic GaN is provided. Also shown are the crystallographic direction (0001), Fermi level $E_{F_n}$, and the schematic conduction band structure of the GaN/AlGaN/GaN tri-layer structure. Because of the polarization mismatch between GaN and AlGaN, there are polarization sheet charges +σ and −σ at the lower and upper interface of the GaN/AlGaN/GaN tri-layer structure. As shown, the lower sheet charge +σ attracts high density electrons in the triangle potential well, forming 2DEG as marked in FIG. 1A; meanwhile the upper sheet charge −σ repels electrons forming an electron-depletion zone in the vicinity of the upper interface.

Similarly, A GaN/AlGaN/GaN tri-layer structure consisting of p-GaN, p-AlGaN or intrinsic AlGaN, and p-GaN is shown in FIG. 1B. Also shown in FIG. 1B are the crystallographic direction (0001), Fermi level $E_{F_p}$, and the schematic valence band structure of the GaN/AlGaN/GaN tri-layer structure. Because of the polarization mismatch between GaN and AlGaN, there are polarization sheet charges +σ and −σ at the lower and upper interface of the GaN/AlGaN/GaN tri-layer structure, respectively. As shown, the upper sheet charge −σ attracts high density holes in the triangle potential well, forming 2DHG as marked in FIG. 1B; and the lower sheet charge +σ repels holes forming a hole-depletion zone in the vicinity of the lower interface.

The 2DEG and 2DHG formed in FIG. 1A and FIG. 1B can have a carrier sheet density more than $10^{13}$ cm$^{-2}$, depending on the Al-composition and thickness of the AlGaN layer in the GaN/AlGaN/GaN tri-layer structure. They provide excellent electric conductivity along the interface (in-plane, lateral direction). However, because of the potential barrier in the AlGaN layer, and the electron-depletion and hole-depletion zones, the 2DEG and 2DHG have poor electric conductivity along the direction perpendicular to the AlGaN/GaN interface (out-of-plane, vertical direction).

FIG. 2A-2D illustrates the fabrication of 2DEG channels with vertical openings in the 2DEG channel plane (in-plane discontinuities). These 2DEG channels can be formed over suitable substrate or template 1. Generally speaking, a template consists of a substrate and a template layer epitaxially formed on the substrate, the template layer can be group-III nitride $Al_xIn_yGa_{1-x-y}N$ ($0 \leq x \leq 1$; $0 \leq y \leq 1$). For group-III nitride visible LEDs, the template layer is preferably to be $Al_xIn_yGa_{1-x-y}N$ with $0 \leq x+y \leq 0.1$.

Shown in FIG. 2A are three continuous 2DEG channels overlying substrate or template 1, formed within three continuous interfaces between three layers 31' and three layers 21' of 2DEG structure 30'. In general, 2DEG channel can be formed at an $Al_{x1}In_{y1}Ga_{1-x1-y1}N/Al_{x2}In_{y2}Ga_{1-x2-y2}N$ interface, where (1-x1-y1) (1-x2-y2), and $1 \geq x1, y1, x2, y2 \geq 0$. Layer 31' in 2DEG structure 30' can be an n-type $Al_{x1}In_{y1}Ga_{1-x1-y1}N$ layer, and layer 21' can be an n-type $Al_{x2}In_{y2}Ga_{1-x2-y2}N$ layer. Preferably, layer 31' can be made of Si-doped or intrinsic $Al_xGa_{1-x}N$, where x can be in the range of 0.1 to 0.4, for example in the range of 0.2 to 0.3, while layer 21' can be made of Si-doped or intrinsic GaN (I-GaN). The thickness of layer 31' can be in the range of 10 to 50 nm, for example in the range of 20 to 30 nm. And the thickness of layer 21' can be preferably in the range of 50 to 200 nm, for example, 100 to 150 nm. Even though illustrated in FIG. 2A the 2DEG structure 30' consists of three pairs of layers 31'/21', it can contain one or two pairs of layers 31'/21', or more than three pairs, for example up to 10 pairs of layers 31'/21' or more. There is a 2DEG channel defined at each 31'/21' interface. In each 2DEG channel, per the selection of the layer composition and layer thickness, the electron sheet density can be more than $10^{13}$ cm$^{-2}$, ensuring excellent electric conduction laterally along the interface of layers 31'/21'. The structure shown in FIG. 2A can be achieved via metalorganic chemical vapor deposition (MOCVD). Silane can be used as n-type doping source, and $NH_3$ as group V source, while Trimethylaluminium (TMA), Trimethylgallium (TMG), Trimethylindium (TMIn) as group III sources. Template 1, preferably consisting of 1-3 µm-thick intrinsic GaN on a substrate such as a sapphire substrate, is loaded into an MOCVD reactor for the deposition of 2DEG structure 30'. The growth of layer 21' and layer 31' can be conducted by method known in the art, such as the method described in U.S. Pat. No. 6,878, 593 and J. Hertkorn et al, Highly conductive modulation doped composition graded p-AlGaN/AlN/GaN multiheterostructures grown by metalorganic vapor phase epitaxy, J. Appl. Phys. 106, 013720 (2009), the content of these two references is herein incorporated by inference in their entirety.

In FIG. 2B, the 2DEG in-plane continuity is interrupted, by forming openings 35 through one or more, or all pairs of layers 31'/21' in the 2DEG structure 30', turning continuous 2DEG structure 30' into 2DEG structure 30 with discontinuities, i.e., interfaces between layers 31' and layers 21' are exposed in openings 35. Openings 35 can be formed via known method such as ion-coupled plasma etching. Openings 35 can be made in any desired pattern, and can be isolated from each other as separate openings, or connected with each other to form continuous grooves. There is no specific limitation to the transverse cross-sectional dimension of opening 35 as long as the 2DEG channel can be exposed and can be in direct and electric contact with a material filled in the openings later. Generally, the transverse cross-sectional dimension of opening 35 can be in the range of 2-10 µm. To provide desired vertical conductivity, the occupation ratio of openings 35 (here it is defined as the ratio of total surface area occupied by openings 35 to the total upper surface area of 2DEG structure 30) can be in the range of 1%-20%, for example, 5%-15%. In FIG. 2C, n-type layer 23, for example Si-doped GaN, is deposited on 2DEG structure 30. Layer 23 fills up openings 35 and planarizes 2DEG structure 30, being in electrical and/or direct contact with 2DEG channels in structure 30 through openings 35. N-type layer 23 can fully or partially fill openings 35. For example, in the case of partially filling opening 35, n-type layer 23 can be formed on sidewalls of openings 35, and/or bottom wall of openings 35.

Figure 2D:
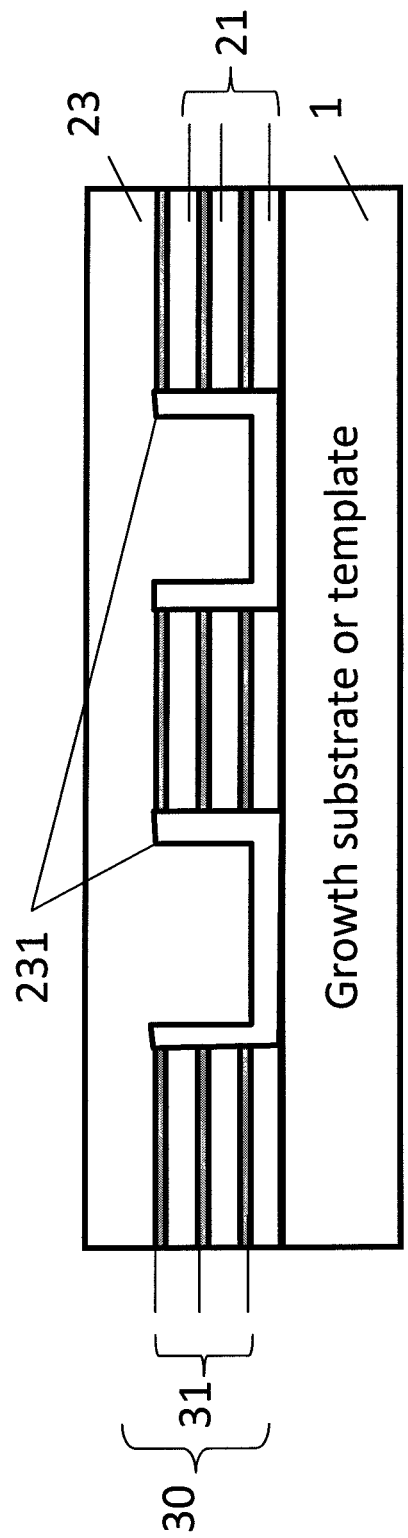

If desirable, a conductive layer 231 (FIG. 2D) having better conductivity than n-type layer 23 can be formed in openings 35 before filling openings 35 with n-type layer 23. For example, the conductive layer 231 can be formed on sidewall and/or bottom wall of openings 35, or fully fills openings 35. Preferably, the material of the conductive layer 231 is so selected that it forms ohmic contact with n-type layer 23 and 2DEG channel of 2DEG structure 30; is suitable for epitaxial growth of III-nitride thereon, and thermally and chemically stable under $H_2/NH_3$ environment at epitaxial growth temperature of III-nitride; and has better conductivity than n-type layer 23. Additionally, the material of conductive layer 231 is preferred to be either transparent or highly reflective to visible light. The materials of interest for conductive layer 231 include, but not limited to, Titanium nitride (TiN), Zirconium nitride (ZrN), Hafnium nitride (HfN), Vanadium nitride (VN), Niobium nitride (NbN), and Tantalum nitride (TaN). For example, Scandium nitride (ScN), Yttrium nitride (YN), Chromium nitride (CrN), Molybdenum nitride (MoN), and Tungsten nitride (WN) also can be used as the material for conductive layer 231. These metallic nitrides have very stable thermal and chemical characteristics. Besides, their electrical resistivity is very small, in the range of 10-50 µΩ·cm. The conductive layer can be formed by known method such as ion sputtering, electron-beam evaporation, or electrochemical plating. For example, after forming openings 35 and without removing the mask which is used to pattern openings 35, the conductive layer 231 is deposited over the mask and into openings 35. Then the mask is removed to expose the upper surface of layer 31, leaving the remaining portions of the conductive layer 231 in openings 35 and exposed. After that, n-type layer 23 is deposited on the upper surface of layer 31 and on the remaining portions of conductive layer 231 in openings 35 as shown in FIG. 2D. The conductive layer 231 can fully or partially fill openings 35. The conductive layer 231 can further improve vertical conductivity. Optionally, a protection layer (not shown in FIG. 2D) with thickness of 0.5-2 µm can be deposited on conductive layer 231 to protect conductive layer 231 from hot hydrogen during the following MOCVD growth steps. The protection layer can be made of silicon dioxide, silicon nitride, or titanium dioxide. In this case, conductive layer 231 forms good ohmic contact with 2DEG structure 30 and template 1, and the protection layer is formed between n-type layer 23 and conductive layer 231. When Zirconium nitride (ZrN), Hafnium nitride (HfN), Scandium nitride (ScN), Yttrium nitride (YN), Chromium nitride (CrN), Molybdenum nitride (MoN), and Tungsten nitride (WN) are used for conductive layer 231, it is particularly preferred to from a protection layer of silicon dioxide, silicon nitride, or titanium dioxide on the conductive layer.

Therefore, electrons stored in 2DEG channels at the interfaces of layers 31/21 are provided with a vertical passage through n-type layer 23 in openings 35. N-type layer 23 can be an n-type III-nitride, such as Si-doped GaN with a doping level of $1 \times 10^{18}$-$2 \times 10^{19}$ cm$^{-3}$, for example, $5 \times 10^{18}$-$1 \times 10^{19}$ cm$^{-3}$, Si-doped $In_yGa_{1-y}N$ (where $0.01 \leq y \leq 0.10$) with a doping level of $1 \times 10^{18}$-$2 \times 10^{19}$ cm$^{-3}$, for example, $5 \times 10^{18}$-$1 \times 10^{19}$ cm$^{-3}$, and Si-doped $Al_xGa_{1-x}N$ (where $0.01 \leq x \leq 0.10$) with a doping level of $1 \times 10^{18}$-$2 \times 10^{19}$ cm$^{-3}$, for example, $5 \times 10^{18}$-$1 \times 10^{19}$ cm$^{-3}$.

In some embodiments, n-type layer 23 has better conductivity than that of layers 21 and 31. In other embodiments, n-type layer 23 may have similar or even poorer conductivity than that of layer 21 or 31. As n-type layer 23 is electrically connected to 2DEG channels via openings 35, it can provide desired conductivity without detrimental high doping level. Since the supply of electrons from 2DEG channel through the vertical conductive passage in openings 35, n-type layer 23 needs not to be heavily doped and still can provide good conductivity.

A 2DHG structure can be formed similarly as previously discussed in connection with 2DEG structure. Instead of being formed on a substrate or a template, a 2DHG structure is formed on a p-type layer and contains one or more p-type $Al_{x1}In_{y1}Ga_{1-x1-y1}N/Al_{x2}In_{y2}Ga_{1-x2-y2}N$ pairs, such as p-type $Al_xGa_{1-x}N/GaN$ pairs, where x1 can be in the range of 0.1 to 0.4, for example in the range of 0.2 to 0.3. The thickness of p-type $Al_x$, $In_{y1}Ga_{1-x1-y1}N$ or $Al_xGa_{1-x}N$ layer can be in the range of 5 to 50 nm, for example in the range of 10 to 20 nm. And the thickness of p-type GaN layer can be in the range of 10 to 200 nm. There can be more than three pairs of the p-type layers, for example up to 10 pairs or more. There is a 2DHG channel at the interface of each pair. In each 2DHG channel, per the selection of layer composition and thickness, the hole sheet density can be more than $10^{13}$ cm$^{-2}$, ensuring excellent hole conduction laterally along the interface of p-type pair.

FIG. 3 illustrates an LED structure adopting 2DEG structure 30. The LED structure is formed on a substrate 10, such as a patterned sapphire substrate. An optional layer 22, such as an I-GaN layer with a thickness of 1-3 µm, is deposited on substrate 10, followed by 2DEG structure 30 and n-type layer 23. Grown on top of n-type layer 23 is an active-region 40 with multiple-quantum-well (MQW), a p-type layer 50 and an indium tin oxide (ITO) layer 60. The patterns of openings 35 in 2DEG structure 30 shown in FIG. 3i-A are substantially parallel continuous grooves, i.e., finger-shaped openings.

In FIG. 3i-A, multiple parallel grooves of openings 35 are illustrated. As shown, electrons can move freely in the 2DEG channel to reach any in-plane position and into the portions of n-type layer 23 which fill into openings 35. Electrons in the 2DEG channels therefore move vertically out-of-plane into the body of n-type layers 23 via the portions filling openings 35, as illustrated by arrows 38 in FIG. 4A. The openings 35 can also be arranged into two-dimensional patterns as isolated openings, as shown in FIG. 3i-B and FIG. 3i-C, where the openings 35 are arranged two-dimensionally with square and triangle lattice structures, respectively. The openings 35 can be of a diameter or transverse cross-section size of 2 µm to 20 µm, such as 2-10 µm. The nearest separation distance (sidewall to sidewall) between neighboring openings 35 can be of 10-50 µm. These arrangements can be optimized to ensure a good vertical and horizontal electric conductivity of the 2DEG structure 30.

Shown in FIG. 4A is the cross-sectional schematic view of an LED according to an embodiment of the present invention. Substrate 10 can be Si, SiC, GaAs, sapphire or any other suitable substrate, with or without a template layer of group III-nitride. For example, substrate 10 can be patterned sapphire substrate. Formed over substrate or template 10 is an optional undoped or intrinsic GaN layer 22, followed by a 2DEG structure 30. The formation of 2DEG structure 30 has been described previously with the illustrations of FIG. 2, FIG. 3, FIG. 3i-A, FIG. 3i-B and FIG. 3i-C. Above 2DEG structure 30, a conventional LED structure comprising n-type layer 23, active-region 40, p-type layer 50' and ITO layer 60 can be formed in sequence by known methods. N-type layer 23 is formed on 2DEG structure 30 and directly contacts with the 2DEG channels therein by filling the openings 35 in the 2DEG structure 30. N-type layer 23 can be made of Si-doped GaN, or InGaN, or AlGaN, with average In or Al composition less than 10%, for example 3%-7%, for visible LEDs, respectively. Active-region 40 can be made of GaN/InGaN multiple-quantum-well, and p-type layers 50' can be Mg-doped p-GaN, p-AlGaN, and p-InGaN. ITO layer 60, usually of thickness of 200-400 nm, is used to spreading current for p-layers.

Then standard lithographic and etching process is performed to form device mesas for p-contact pad 82 and n-contact pad 81, and mesa edges are protected with a passivation layer 70, preferably made of silicon nitride or silicon dioxide. In the embodiment shown in FIG. 4A, in addition to the conventional p-mesa M1 which is formed for p-contact pad 82, there is another n-mesa M2. Mesa M2 is formed in n-type layer 23 for better current spreading. Mesa M2 has an upper step surface and a lower step surface connected to the upper step surface by a sidewall. N-contact pad 81 formed over mesa M2 therefore is a stepped contact containing three portions: portion 813 formed on the upper step surface of mesa M2, portion 812 formed on the sidewall of mesa M2, and portion 811 formed on the lower step surface of mesa M2. Portion 812 enhances lateral current spreading in n-type layer 23, and portion 811 enhances lateral current spreading in 2DEG structure 30. Therefore, the vertical height t1 of the sidewall of M2 is close to the thickness of the main body of layer 23. This means that the separation distance t2 from bottom surface of portion 811 to upper surface of 2DEG structure 30 is preferred to be small, for example, t2 is less than 0.5 µm, or less than 0.1 µm. The thickness of the etched portion at the top of n-type layer 23 (corresponding to the upper step surface of mesa M2) can be in the range of 0.2-0.5 µm. The arrangement of n-contact pad 81, together with 2DEG structure 30, greatly facilitates lateral current spreading, avoiding current crowding around p-mesa (M1) edge, and reduces LED's series resistance. The embodiment shown in FIG. 4A can have a plan-view schematic presented in FIG. 4B. Or, the embodiment in FIG. 4A can be the cross-sectional view of the embodiment in FIG. 4B along the cutting line A-A. As can be seen in FIG. 4B, p-contact pad 82 and n-contact pad 81 are located at two opposite corners to have a maximal distance between the two contacts. The two contacts can also be placed in other locations. Contact pads 81 and 82 can be made of Ni/Au or other suitable metal or metal alloys. Contact portions 811 and 813 are preferably to be of length substantially equal to the width of the LED chip. That is to say, the length of portions 811 and 813 can be in the range of 100 to 1500 µm. The width of portions 811 and 813 can be in the range of 2-10 µM as shown in FIG. 4B. Contact portions 811 and 813 can be made of transparent conductive layer such as ITO, or Ni/Au, NiO$_x$/Au.

Similarly, 2DHG structure can also be incorporated into an LED structure for better hole-current spreading. Shown in FIG. 5 is an embodiment according to the present invention, showing an LED structure including 2DEG structure 30 and 2DHG structure 50. In another embodiment, an LED structure may contain 2DHG structure 50 only without 2DEG structure 30. The formation of 2DHG structure is similar to 2DEG structure, as explained in connection with FIGS. 2A-2D. The p-type AlGaN layer 53 in 2DHG structure 50 can have an Al-composition from 10% to 30% (i.e., in formula Al$_{x1}$Ga$_{1-x1-y1}$N, x1 can be in the range of 0.1 to 0.3.), with a thickness from 5 nm to 15 nm, while the p-GaN layer 52 in 2DHG structure 50 can have a thickness from 10 nm to 30 nm. And the number of layer 53/52 pairs can be from one to 10 pairs or more. With this composition and thickness arrangement, 2DHG structure 50 can have 2DHG channels with hole-concentration greater than $10^{13}$ cm$^{-2}$ or, equally, 2DHG structure 50 can have bulk hole concentration great than $10^{19}$ cm$^{-3}$. 2DHG structure 50 can have openings 57 with pattern and dimension similar to that of openings 35 in 2DEG structure 30.

As shown in FIG. 5, in-between MQW 40 and 2DHG structure 50 there can be a p-GaN or p-InGaN protection layer 51, used to protect MQW 40 during the formation of 2DHG structure 50, which is similar to the formation of 2DEG structure 30 including: forming a 2DHG structure with continuous interfaces and 2DHG channels, etching the 2DHG structure and forming openings to expose the 2DHG channels and layer 51, and growing a p-GaN layer 57 to fill the openings so as to provide a vertical passage for the holes in the 2DHG channels. If desirable, the openings in the 2DHG structure can be filled or coated with a conductive layer with better conductivity than p-GaN layer 57. The materials of interest for the conductive layer include, but not limited to, ITO, Zinc oxide, Titanium nitride, Zirconium nitride, Hafnium nitride, Vanadium nitride, Niobium nitride, and Tantalum nitride.

The embodiment shown in FIG. 5 incorporated with 2DEG and 2DHG structures can have improved hole- and electron-current spreading, possessing low forward operation voltage.

In another embodiment of the present invention, the formation of 2DEG structure with a vertically displaced structure for better vertical conduction can be achieved in-situ during epitaxial growth of an LED structure. In this case, a structured template or substrate is used, as illustrated in FIG. 6A and FIG. 7. As shown in FIG. 6A, FIG. 6B and FIG. 6C, the structured template or substrate 10 possesses recesses and/or protrusions on its surface so as to form at least two sets of growth surfaces, upper surfaces 102 and lower surfaces 101. The two sets of growth surfaces are vertically displaced by a height h. The sidewalls that connect the upper surfaces 102 and the corresponding lower surfaces 101 should be steep enough so that the 2DEG structure formed on upper surfaces 102 and lower surfaces 101 is vertically displaced into a plurality of upper portions formed on upper surfaces 102 and a plurality of lower portions formed on lower surfaces 101. The upper and lower surfaces 102 and 101 can be created by forming a plurality of recesses in template/substrate 10, for example, forming a set of hexagonal holes in template/substrate 10, as illustrated in FIG. 6B. The vertically displaced surfaces can also be produced by forming a plurality of protrusions in template/substrate 10, for example, forming a set of hexagonal pillars in template/substrate 10, as illustrated in FIG. 6C. In FIG. 6B the recesses are separated from each other by a dimension d3 at upper surface and a dimension d2 at lower surface, with a recess deepness h. In FIG. 6C the protrusions have a dimension d3 at their top surface, a dimension d2 at bottom thereof, and are separated from each other by a dimension d1 at bottom thereof, with a protrusion height h. The arrangement patterns of the upper and lower surface units can be random, or regular one-dimensional as shown in FIG. 3$i$-A, or two-dimensional patterns as shown in FIG. 3$i$-B, FIG. 3$i$-C, FIG. 6B and FIG. 6C. The preferred dimensions d1, d2, d3, and h are in the ranges of 2-5, 5-10, 5-10, and 1-3 microns, respectively. Upper surfaces 102 may be positioned in one plane or in multiple planes at different levels, and lower surfaces 101 may also be positioned in one plane or in multiple planes at different levels.

As shown in FIG. 6A, firstly an n-type layer such as an intrinsic GaN layer 22 is deposited on the structured template or substrate 10. Layer 22 comprises a plurality of layers 222 formed on upper surfaces 102, and layers 221 formed on lower surfaces 101. This is followed by depositing 2DEG structure 30, which comprises a plurality of upper portions 302 and a plurality of lower portions 301 grown respectively on layers 222 and layers 221. Since upper portions 302 and lower portions 301 are vertically displaced, 2DEG structure 30 possesses discontinuities at boundary between upper portions 302 and neighboring lower portions 301, which enhance vertical conduction. At least some of the 2DEG channels in the upper portions 302 are exposed and in direct contact with n-type layer 23, while some of the 2DEG channels in lower portions 301 can be in lateral contact with the layers in neighboring upper portions 302. If the thickness of layer 22 is large enough, most or all of the 2DEG channels in the upper portions 302 will be exposed. Stepped n-contact 81 can also be used in this embodiment.

As shown in FIG. 6A, recesses 35" which constitute one form of discontinuities as discussed above are formed between upper portions 302 and corresponding lower portions 301 of 2DEG structure 30 and filled with n-type layer 23. In another embodiment, recesses 35" can be partially or fully filled, or coated with a conductive layer 231 (not shown in FIG. 6A). Then, n-type layer 23 is formed on conductive layer 231 and 2DEG structure 30 to fill recesses 35" in a similar manner as discussed in connection with FIG. 2D.

The embodiment shown in, FIG. 7 further includes a 2DHG structure 50, otherwise is similar to the embodiment shown in FIG. 6A.

In another embodiment, the formation of 2DEG or 2DHG structure with discontinuities in the form of voids 35' for better vertical conduction can also be achieved in-situ during epitaxial growth of the 2DEG or 2DHG structure, via growth facet control. Epitaxy facet control is well known by those skilled in the art. For example, as disclosed in U.S. Pat. No. 6,468,347 which is hereby incorporated by reference in its entirety, selective-area growth with masks results in facet GaN growth. It is also known by the field of interest that by changing growth conditions, such as growth temperature, growth pressure, and growth V/III ratio, three-dimensional growth mode can be initiated and enhanced, resulting in growth surface roughness with micro-facets.

Shown in FIG. 8 is an embodiment with in-situ formed 2DEG structure with discontinuities in the form of voids 35', via in-situ growth roughness control. An intrinsic GaN layer 22' grown on template or substrate 10 possesses surface roughness or micro-facets. Intrinsic GaN layer 22' can be formed by growth at low temperatures from 700-950° C., with high V/III ratios from 3000-30000.

The 2DEG structure shown in FIG. 8 can be obtained via MOCVD process. In one embodiment, a sapphire substrate 10 is loaded into an MOCVD reactor, and undergone with a thermal treatment, for example, under hydrogen ambient for 10 minutes at 1100° C., to remove surface damages or contaminants if any. Then temperature of substrate 10 is lowered to 450-600° C. and ammonia, TMG, TMIn, and TMA are introduced to form a 20-50 nm-thick AlInGaN buffer (not shown) on substrate 10. The temperature of substrate 10 is then heated up again to re-crystallize the buffer for growth of intrinsic GaN layer 22'. A reflectance measurement, as is equipped in most commercial MOCVD systems, is used to monitor surface reflectance, hence surface roughness. Growth conditions favoring three-dimensional growth are used for intrinsic GaN layer 22'. The growth temperatures are preferably from 700-950° C., V/III ratios from 3000-30000, and growth rate from 1.5 to 3 µm/hour. When the nominal thickness of intrinsic GaN layer 22' approaching 0.5-1.2 µm, the surface reflectance is virtually zero, for example, being less than 0.3%, or less than 0.1%. This means that via three-dimensional growth control, intrinsic GaN layer 22' gains maximal surface roughness. At this point, TMA and TMG are simultaneously introduced into MOCVD reactor to form one or more AlGaN layers 31, and TMG source is used to form one or more GaN layers 21. Multiple alternations of layer 31 and layer 21 form 2DEG structure 30 with in-plane discontinuities in the form of voids 35' as shown in FIG. 8. The voids 35' are formed in layers 21 and 31, exposing the interface hence the 2DEG channel between GaN layer 21 and AlGaN layer 31. Optionally, intrinsic GaN layer 22' can grow directly on substrate 10 without the AlInGaN buffer.

Then temperature of substrate 10 is raised up to 1000-1100° C. for two-dimensional growth of n-type GaN layer 23 by introducing silane as dopant and TMG as gallium source. N-type GaN layer 23 planarizes 2DEG structure 30 by filling up the voids 35' in-between rough three-dimensional growth islands, making electric access to 2DEG structure 30. In other words, the portions of layer 23 that fill the voids are in direct contact with the 2DEG channels at the interfaces of 31/21 layers in 2DEG structure 30. Voids 35' can also be partially or fully filled, or coated, with conductive layer 231 (not shown), then n-type layer 23 is formed on the conductive layer 231 in voids 35' in a similar manner as discussed in connection with FIG. 2D.

Even though in FIG. 4 to FIG. 8 the LED embodiments are shown to be of lateral injection structure (i.e., p- and n-contacts on the same side), the 2DEG structure 30 and 2DHG structure 50 with in-plane discontinuities for better vertical conduction can also be applied to vertical LED structures (i.e., p- and n-contacts on the opposite sides), which therefore are also in the scope of the present invention.

It will be apparent to those skilled in the art that various modifications and variations can be made to the disclosed embodiments without departing from the scope or spirit of the invention. In view of the foregoing, it is intended that the invention cover modifications and variations of this invention provided they fall within the scope of the following claims and their equivalents.

What is claimed is:

1. A light-emitting device comprising:
a two-dimensional electron gas (2DEG) structure;
an n-type layer formed on the two-dimensional electron gas structure;
a p-type layer;
an active region sandwiched between the n-type layer and the p-type layer;
a p-contact electrically connected to the p-type layer; and
an n-contact electrically connected to the n-type layer,
wherein the n-type layer has a stepped structure with an upper step surface and a lower step surface being connected by a sidewall, and the n-contact is conformably formed on the upper step surface, the lower step surface and the sidewall of the stepped structure of the n-type layer;
wherein the two-dimensional electron gas structure comprises one or more pairs of n-type GaN layers and n-type AlGaN layers, each of the one of more pairs of n-type GaN layer and n-type AlGaN layer is so selected that an interface thereof defines a 2DEG channel, thus the one or more pairs of n-type GaN layers and n-type AlGaN layers form one or more 2DEG channels, a plurality of discontinuities are formed in the two-dimensional electron gas structure exposing the one or more 2DEG channels, and the n-type layer is formed on the two-dimensional electron gas structure and in electrical contact with the one or more 2DEG channels through the plurality of discontinuities.

2. The light-emitting device of claim 1, wherein the n-type layer fills the plurality of discontinuities and is in direct contact with the one or more 2DEG channels.

3. The light-emitting device of claim 1, wherein the one or more n-type AlGaN layers of the two-dimensional electron gas structure are Si-doped AlGaN layers and have a composition of $Al_xGa_{1-x}N$, where $0.10 \leq x \leq 0.40$.

4. The light-emitting device of claim 1, wherein the one or more n-type GaN layers of the two-dimensional electron gas structure are made of Si-doped GaN.

5. The light-emitting device of claim 1, wherein the n-type layer is made of Si-doped GaN, or Si-doped $In_yGa_{1-y}N$ where $0.01 \leq y \leq 0.10$, or Si-doped $Al_xGa_{1-x}N$, where $0.01 \leq x \leq 0.10$.

6. The light-emitting device of claim 1, wherein the one or more 2DEG channels have a sheet electron density more than $10^{13}$ cm$^{-2}$.

7. The light-emitting device of claim 1, wherein the plurality of discontinuities are in the form of openings formed in the two-dimensional electron gas structure and exposing at least one 2DEG channel.

8. The light-emitting device of claim 1, wherein the plurality of discontinuities are in the form of voids formed in the two-dimensional electron gas structure by growing the two-dimensional electron gas structure on a rough surface via epitaxy facet control and the voids expose at least one 2DEG channel.

9. The light-emitting device of claim 1, further comprising:
a p-type protection layer formed on the active region; and
a two-dimensional hole gas (2DHG) structure formed on the p-type protection layer,
wherein the two-dimensional hole gas structure comprises one or more pairs of p-type GaN layers and p-type AlGaN layers, each of the one of more pairs of p-type GaN layer and p-type AlGaN layer is so selected that an interface thereof defines a 2DHG channel, thus the one or more pairs of p-type GaN layers and p-type AlGaN layers form one or more 2DHG channels, and a plurality of openings are formed in the two-dimensional hole gas structure exposing the one or more 2DHG channels and the p-type protection layer, and the p-type layer is formed on the two-dimensional hole gas structure filling the plurality of openings so as to electrically connect the one or more 2DHG channels to the p-type protection layer through the plurality of openings.

10. The light-emitting device of claim 9, wherein the one or more p-type AlGaN layers of the two-dimensional hole gas structure are made of Mg-doped AlGaN, and have a composition of $Al_xGa_{1-x}N$, where $0.10 \leq x \leq 0.30$.

11. The light-emitting device of claim 9, wherein the one or more 2DHG channels have a sheet hole density more than $10^{13}$ cm$^{-2}$.

12. The light-emitting device of claim 1, further comprising a conductive layer partially or fully filling the plurality of discontinuities and in direct contact with the one or more 2DEG channels, wherein the conductive layer has a higher conductivity than the n-type layer, and the n-type layer is electrically connected to the one or more 2DEG channels through the conductive layer.

13. The light-emitting device of claim 12, wherein the conductive layer is made of Titanium nitride, Zirconium nitride, Hafnium nitride, Vanadium nitride, Niobium nitride, Tantalum nitride, Scandium nitride, Yttrium nitride, Chromium nitride, Molybdenum nitride, or Tungsten nitride.

* * * * *